(12) United States Patent
Sawada

(10) Patent No.: US 8,759,839 B2
(45) Date of Patent: Jun. 24, 2014

(54) SEMICONDUCTOR MODULE AND METHOD FOR MANUFACTURING SEMICONDUCTOR MODULE

(71) Applicant: Sumitomo Electric Industries, Ltd., Osaka (JP)

(72) Inventor: Kenichi Sawada, Osaka (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 0 days.

(21) Appl. No.: 13/665,394

(22) Filed: Oct. 31, 2012

(65) Prior Publication Data
US 2013/0112994 A1 May 9, 2013

Related U.S. Application Data

(60) Provisional application No. 61/555,953, filed on Nov. 4, 2011.

(30) Foreign Application Priority Data

Nov. 4, 2011 (JP) .................................. 2011-241856

(51) Int. Cl.
*H01L 31/0312* (2006.01)

(52) U.S. Cl.
USPC ................................ 257/77; 257/76; 438/125

(58) Field of Classification Search
USPC ........................ 257/76, 77, E29.084; 438/125
See application file for complete search history.

(56) References Cited

U.S. PATENT DOCUMENTS

| 8,468,690 | B2* | 6/2013 | Kumagai et al. ................. 29/832 |
| 2003/0138992 | A1* | 7/2003 | Rokugawa et al. ........... 438/106 |
| 2012/0070699 | A1* | 3/2012 | Imaizumi et al. ................. 429/7 |
| 2012/0098138 | A1* | 4/2012 | Oka et al. ....................... 257/773 |

FOREIGN PATENT DOCUMENTS

JP 06-085126 A2 3/1994

* cited by examiner

*Primary Examiner* — Phuc Dang
(74) *Attorney, Agent, or Firm* — Venable LLP; Michael A. Sartori; F. Brock Riggs

(57) ABSTRACT

The semiconductor module includes a base and at least one circuit substrate. The at least one circuit substrate has a supporting substrate and a semiconductor element supported by the supporting substrate. The base and/or the supporting substrate has a structure for fitting the at least one circuit substrate with the base.

12 Claims, 40 Drawing Sheets

SEMICONDUCTOR MODULE AND METHOD FOR MANUFACTURING SEMICONDUCTOR MODULE

CROSS-REFERENCE RELATED APPLICATIONS

This application claims priority to Provisional Application Ser. No. 61/555,953, filed on Nov. 4, 2011 and claims the benefit of Japanese Patent Application No. 2011-241856, filed on Nov. 4, 2011, all of which are incorporated herein by reference in their entirety.

BACKGROUND

1. Field

The present invention relates to a semiconductor module and a method for manufacturing the semiconductor module.

2. Related Background

A semiconductor module including a ceramic substrate on which a semiconductor element is mounted and a metal base to which the ceramic substrate is attached is known (refer to Japanese Unexamined Patent Publication No. 6-85126).

PRIOR ART DOCUMENT

Summary

However, in the above-mentioned semiconductor module, when the ceramic substrate is attached to the metal base by soldering or the like, the ceramic substrate might be displaced from a desired position. For this reason, it is not easy to improve the positioning accuracy between the ceramic substrate and the metal base.

The present invention is made in view of the above-mentioned circumstances, and has an object to provide a semiconductor module having a high positioning accuracy between a circuit substrate having a semiconductor element and a base, and a method for manufacturing the semiconductor module.

To solve the above-mentioned problem, a semiconductor module according to an aspect of the present invention is a semiconductor module including a base and at least one circuit substrate, wherein the at least one circuit substrate has a supporting substrate and a semiconductor element supported by the supporting substrate, and the base and/or the supporting substrate has a structure for fitting the at least one circuit substrate with the base.

In this semiconductor module, by fitting the circuit substrate with the base, a high positioning accuracy between the circuit substrate and the base can be obtained.

In an embodiment, in the semiconductor module, the at least one circuit substrate may include a plurality of circuit substrates, and each of the plurality of circuit substrates may have the supporting substrate and the semiconductor element.

When the semiconductor element is mounted on the supporting substrate, a defective semiconductor element may occur due to a stress caused by mounting. Since it is difficult to directly inspect the semiconductor element, the semiconductor element is generally inspected after being mounted on the supporting substrate. Here, if the plurality of semiconductor elements is supported by the single supporting substrate, when at least one defective semiconductor element is found in the inspection, all of the semiconductor elements supported by the supporting substrate are wasted. In the above-mentioned semiconductor module, it is possible to individually inspect the circuit substrates, select the non-defective circuit substrate and selectively fit the selected non-defective circuit substrate with the base. For this reason, as compared to the case where the plurality of semiconductor elements is supported by the single supporting substrate, the manufacturing yield of the semiconductor module can be improved.

When the plurality of semiconductor elements is supported by the single supporting substrate, to prepare for the case where the defective semiconductor element is found, a space for mounting the new non-defective semiconductor element may be provided in the supporting substrate. In this case, the size of the supporting substrate increases. On the contrary, since the above-mentioned semiconductor module does not require such space, the size of the semiconductor module can be reduced.

Moreover, in the above-mentioned semiconductor module, as compared to the case where the plurality of semiconductor elements is supported by the single supporting substrate, the size of each circuit substrate can be reduced, and therefore the circuit substrate can be prevented from warping due to stress.

In an embodiment, the semiconductor module may further include an insulating support that supports a terminal electrically connected to the semiconductor element and is attached to the base.

In this case, since the terminal and the insulating support are integrated, assembling of the semiconductor module is simplified.

In an embodiment, the base may have a recess or a protrusion as the structure.

In an embodiment, the base may have a groove as the structure. In this case, since the circuit substrate can be slid along the groove and fitted with the base, assembling of the semiconductor module is simplified.

In an embodiment, the groove may become deeper along its extending direction. In this case, since an end of the circuit substrate is easy to be inserted into the deepened portion of the groove, assembling of the semiconductor module is simplified.

In an embodiment, the semiconductor module may further include a fixing member fixing the at least one circuit substrate to the base. In this case, a higher positioning accuracy between the circuit substrate and the base can be obtained.

In an embodiment, the structure may be formed asymmetrically about an axis line that passes the center of a main surface of the at least one circuit substrate and is perpendicular to the main surface. In this case, since the orientation of the circuit substrate with respect to the base is uniquely determined, the circuit substrate can be prevented from being fitted with the base with wrong orientation. As a result, assembling of the semiconductor module is simplified.

In an embodiment, the semiconductor element may include a wide bandgap semiconductor. The wide bandgap semiconductor may be SiC or GaN.

A method for manufacturing a semiconductor module according to an aspect of the present invention includes a step of fitting at least one circuit substrate with a base, the at least one circuit substrate having a supporting substrate and a semiconductor element supported by the supporting substrate, and the base and/or the supporting substrate has a structure for fitting the at least one circuit substrate with the base.

According to the method for manufacturing the semiconductor module, by fitting the circuit substrate with the base, the semiconductor module having a high positioning accuracy between the circuit substrate and the base can be obtained.

A method for manufacturing a semiconductor module according to another aspect of the present invention includes the steps of attaching an insulating support supporting a terminal arranged opposed to a groove to a base having the groove, inserting a first end of a circuit substrate between the terminal and the base, the circuit substrate having a supporting substrate and a semiconductor element supported by the supporting substrate, and fixing a second end that is different from the first end of the circuit substrate to the base by a fixing member, to electrically connect the terminal to the semiconductor element and to fit the circuit substrate with the groove of the base.

According to the method for manufacturing a semiconductor module, by fitting the circuit substrate with the base, the semiconductor module having a high positioning accuracy between the circuit substrate and the base can be obtained. Further, when the first end of the circuit substrate is inserted between the terminal and the base, even if the terminal presses the first end and thus an opposite end of the circuit substrate floats, the fixing member can fit the circuit substrate with the groove of the base.

In an embodiment, the groove may become deeper along an extending direction of the groove.

In this case, since a space between the terminal and a bottom of the groove can be kept wide, the first end of the circuit substrate can be diagonally inserted. As a result, assembling of the semiconductor module is simplified. Further, when the fixing member fixes the second end to the base, electrical connection between the terminal and the semiconductor element is ensured more reliably by the principle of leverage.

As mentioned above, the semiconductor module having a high positioning accuracy between the circuit substrate having the semiconductor element and the base, and the method for manufacturing the semiconductor module can be provided.

DETAILED DESCRIPTION

Figure 1:
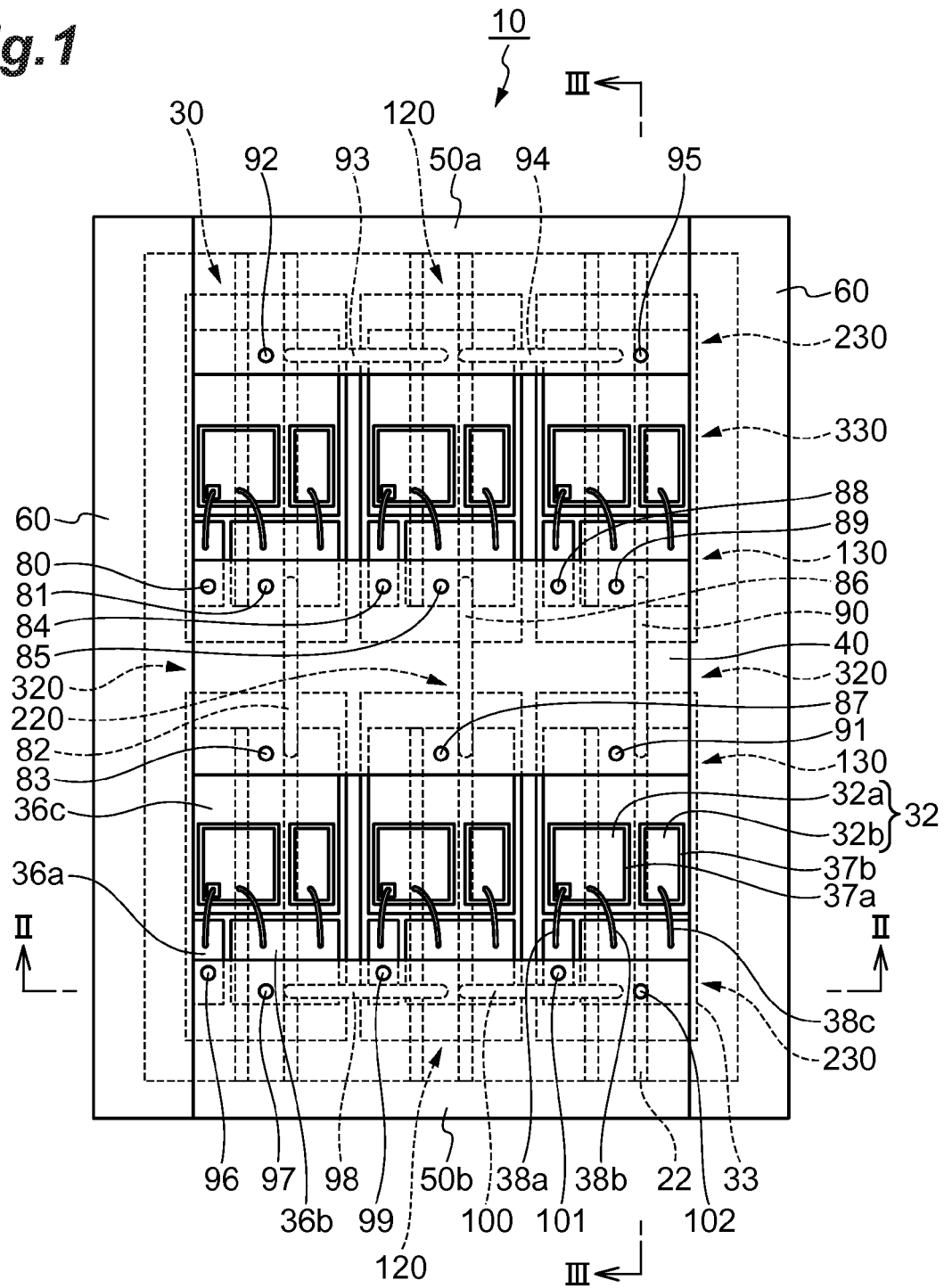
FIG. 1 is a plan view schematically showing a semiconductor module in accordance with First embodiment.

Embodiments of the present invention will be described below in detail with reference to appended figures. In description of the figures, the same or similar components are given the same reference numerals, and redundant description thereof is omitted.

First Embodiment

Semiconductor Module

Figure 2:
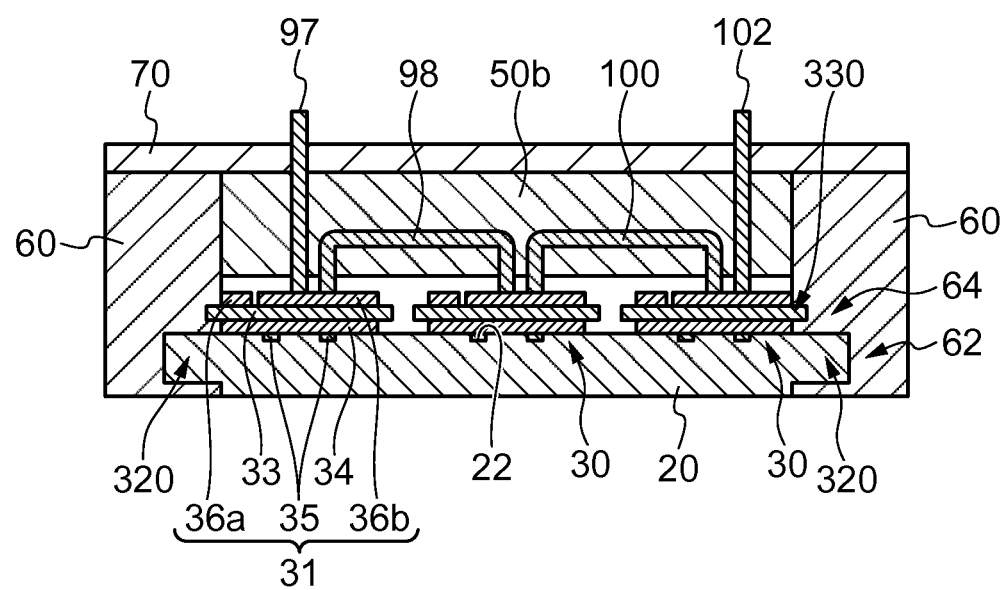
FIG. 2 is a sectional view showing the semiconductor module taken along a line II-II in FIG. 1.
Figure 3:
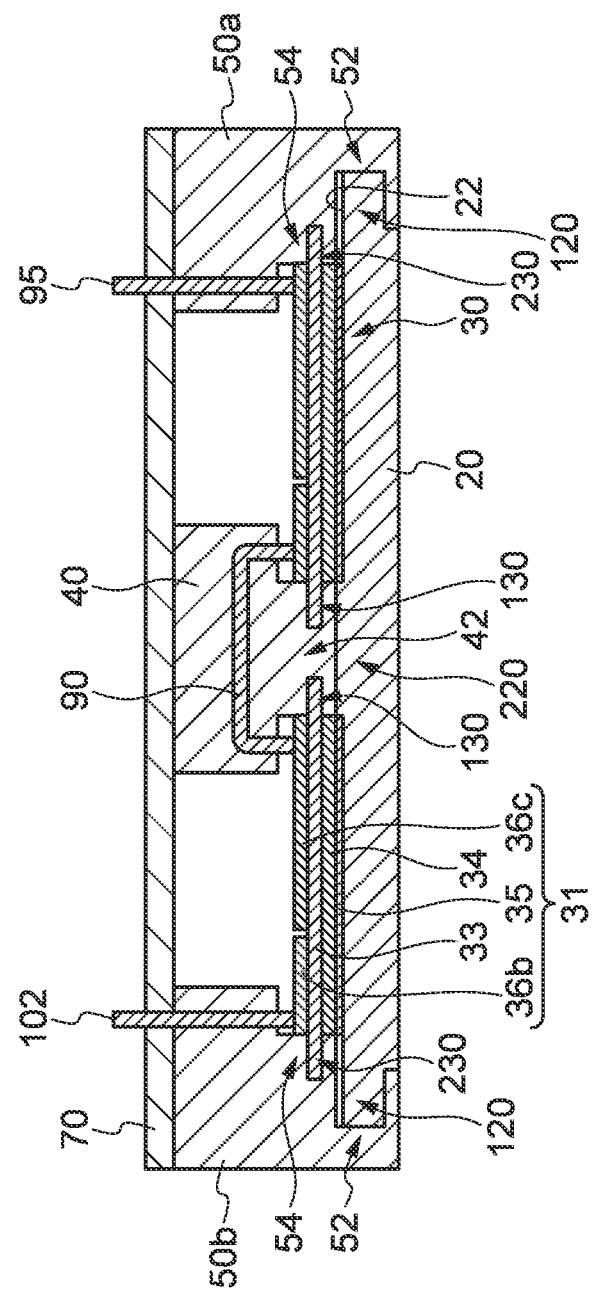
FIG. 3 is a sectional view showing the semiconductor module taken along a line III-III in FIG. 1.

FIG. 1 is a plan view schematically showing a semiconductor module in accordance with First embodiment. FIG. 2 is a sectional view showing the semiconductor module taken along a line II-II in FIG. 1. FIG. 3 is a sectional view showing the semiconductor module taken along a line III-III in FIG. 1. In FIG. 1, a cover 70 is not shown for convenience.

A semiconductor module 10 shown in FIGS. 1 to 3 includes a base 20 and a plurality of (in this embodiment, six) circuit substrates 30. The plurality of circuit substrates 30 can be arranged in an array on the base 20. The semiconductor module 10 may include single circuit substrate 30. The plurality of circuit substrates 30 each has a supporting substrate 31 and a semiconductor element 32 supported by the supporting substrate 31 (refer to FIG. 6 to FIG. 8).

The base 20 can be a metal base containing, for example, metal such as Cu and Al. The base 20 can function as a heatsink. The base 20 may have grooves 22 as a structure for fitting the circuit substrates 30 with the base 20. Each groove 22 can be formed from opposing ends 120 of the base 20 toward a central portion 220 of the base 20. The groove 22 may be a recess.

The supporting substrate 31 can include an insulating substrate 33, electrode pads 36a, 36b, 36c provided on a main surface of the insulating substrate 33, and a metal layer 34 provided on a surface opposite to the main surface of the insulating substrate 33. The insulating substrate 33 contains, for example, ceramics such as AlN and $Al_2O_3$. The electrode pads 36a, 36b, 36c and the metal layer 34 contain, for example, Cu. On the metal layer 34, a protrusion 35 to be fitted with the groove 22 in the base 20 can be formed. The protrusion 35 can extend in one direction. The protrusion 35 contains, for example, a metal such as Cu. The cross-sectional shape of the protrusion 35 perpendicular to its extending direction is rectangular, for example.

The semiconductor element 32 is, for example, a semiconductor chip. The semiconductor element 32 includes a wide bandgap semiconductor. In this case, the heat amount generated from this semiconductor element 32 is larger than that from a semiconductor element made of silicon, but heat is properly radiated by the base 20. Examples of the wide bandgap semiconductor include a compound semiconductor such as SiC and GaN. In such case, the semiconductor element 32 can function as a power semiconductor element.

The semiconductor element 32 can include a transistor 32a and a diode 32b. Examples of the transistor 32a include a bipolar transistor, an MOSFET, an insulating gate bipolar transistor (IGBT). The transistor 32a is electrically connected to the electrode pad 36c via a solder 37a. The diode 32b is electrically connected to the electrode pad 36c via a solder 37b. A gate of the transistor 32a is electrically connected to the electrode pad 36a via a wire 38a. A source of the transistor 32a is electrically connected to the electrode pad 36b via a wire 38b. The diode 32b is electrically connected to the electrode pad 36b via a wire 38c.

The semiconductor module 10 may include an insulating support 40 attached to the base 20. The insulating support 40 is attached to the central portion 220 of the base 20. The insulating support 40 has a holding part 42 holding an end 130 (first end) of the circuit substrates 30. The insulating support 40 supports terminals 80 to 91 to be electrically connected to the semiconductor element 32. The terminals 80 to 91 protrude from the insulating support 40 toward the end 130 of the circuit substrate 30 on the base 20.

The semiconductor module 10 may include insulating supports 50a, 50b attached to the base 20. The insulating supports 50a, 50b are attached to the opposing ends 120 of the base 20, respectively. Each of the insulating supports 50a, 50b has a holding part 52 holding the end 120 of the base 20 and a holding part 54 holding an end 230 (second end) of the circuit substrate 30. The end 230 of the circuit substrate 30 is located on the opposite side of the end 130 along the extending direction of the groove 22. The insulating support 50a supports terminals 92 to 95 electrically connected to the semiconductor element 32. The terminals 92 to 95 protrude from the insulating support 50a toward the end 230 of the circuit substrate 30 on the base 20. The insulating support 50b supports terminals 96 to 102 electrically connected to the semiconductor element 32. The terminals 96 to 102 protrude from the insulating support 50b toward the end 230 of the circuit substrate 30 on the base 20.

The semiconductor module 10 may include insulating supports 60 to be attached to the base 20. The insulating supports 60 are attached to both respective opposing side parts 320 of the base 20 so as to sandwich the insulating supports 40, 50a, 50b therebetween. The insulating supports 60 each have a holding part 62 holding the respective opposing side parts 320 of the base 20 and a holding part 64 holding a side part 330 of the circuit substrate 30. The insulating supports 60 support no terminal.

The insulating supports 40, 50a, 50b, 60 contain, for example, resin. The terminals 80 to 102 are, for example, metal wires. The terminals 80 to 102 may directly contact the semiconductor element 32 (for example, spring contact), or may be connected to the semiconductor element 32 by wire bonding or the like.

The terminal 80 is connected to the electrode pad 36a of the first semiconductor element 32, passes through the insulating support 40, and protrudes to the outside of the semiconductor module 10. The terminal 81 is connected to the electrode pad 36b of the first semiconductor element 32, passes through the insulating support 40, and protrudes to the outside of the semiconductor module 10. The terminal 82 is connected to the electrode pad 36b of the first semiconductor element 32, and is connected to the electrode pad 36c of the second semiconductor element 32 through the insulating support 40. The terminal 83 is connected to the electrode pad 36a of the second semiconductor element 32, passes through the insulating support 40, and protrudes to the outside of the semiconductor module 10.

The terminal 84 is connected to the electrode pad 36a of the third semiconductor element 32, passes through the insulating support 40, and protrudes to the outside of the semiconductor module 10. The terminal 85 is connected to the electrode pad 36b of the third semiconductor element 32, passes through the insulating support 40, and protrudes to the outside of the semiconductor module 10. The terminal 86 is connected to the electrode pad 36b of the third semiconductor element 32, and is connected to the electrode pad 36c of the fourth semiconductor element 32 through the insulating support 40. The terminal 87 is connected to the electrode pad 36a of the fourth semiconductor element 32, passes through the insulating support 40, and protrudes to the outside of the semiconductor module 10.

The terminal 88 is connected to the electrode pad 36a of the fifth semiconductor element 32, passes through the insulating support 40, and protrudes to the outside of the semiconductor module 10. The terminal 89 is connected to the electrode pad 36b of the fifth semiconductor element 32, passes through the insulating support 40, and protrudes to the outside of the semiconductor module 10. The terminal 90 is connected to the electrode pad 36b of the fifth semiconductor element 32, and is connected to the electrode pad 36c of the sixth semiconductor element 32 through the insulating support 40. The terminal 91 is connected to the electrode pad 36a of the sixth semiconductor element 32, passes through the insulating support 40, and protrudes to the outside of the semiconductor module 10.

The terminal 92 is connected to the electrode pad 36c of the first semiconductor element 32, passes through the insulating support 50a, and protrudes to the outside of the semiconductor module 10. The terminal 93 is connected to the electrode pad 36c of the first semiconductor element 32, and is connected to the electrode pad 36c of the third semiconductor element 32 through the insulating support 50a. The terminal 94 is connected to the electrode pad 36c of the third semiconductor element 32, and is connected to the electrode pad 36c of the fifth semiconductor element 32 through the insulating support 50a. The terminal 95 is connected to the electrode pad 36c of the fifth semiconductor element 32, passes through the insulating support 50a, and protrudes to the outside of the semiconductor module 10.

The terminal 96 is connected to the electrode pad 36a of the second semiconductor element 32, passes through the insulating support 50b, and protrudes to the outside of the semiconductor module 10. The terminal 97 is connected to the electrode pad 36b of the second semiconductor element 32, passes through the insulating support 50b, and protrudes to the outside of the semiconductor module 10. The terminal 98 is connected to the electrode pad 36b of the second semiconductor element 32, and is connected to the electrode pad 36b of the fourth semiconductor element 32 through the insulating support 50b. The terminal 99 is connected to the electrode pad 36a of the fourth semiconductor element 32, passes through the insulating support 50b, and protrudes to the outside of the semiconductor module 10. The terminal 100 is connected to the electrode pad 36b of the fourth semiconductor element 32, and is connected to the electrode pad 36b of the sixth semiconductor element 32 through the insulating support 50b. The terminal 101 is connected to the electrode pad 36a of the sixth semiconductor element 32, passes through the insulating support 50b, and protrudes to the outside of the semiconductor module 10. The terminal 102 is connected to the electrode pad 36b of the sixth semiconductor element 32, passes through the insulating support 50b, and protrudes to the outside of the semiconductor module 10.

The semiconductor module 10 may further include a cover 70 that is arranged on the insulating supports 40, 50a, 50b, 60 and is arranged opposed to the base 20. The cover 70 can be formed with through holes through which the terminals 80, 81, 83, 84, 85, 87, 88, 89, 91, 92, 95, 96, 97, 99, 101, 102 pass. The cover 70 contains, for example, resin.

Figure 4:
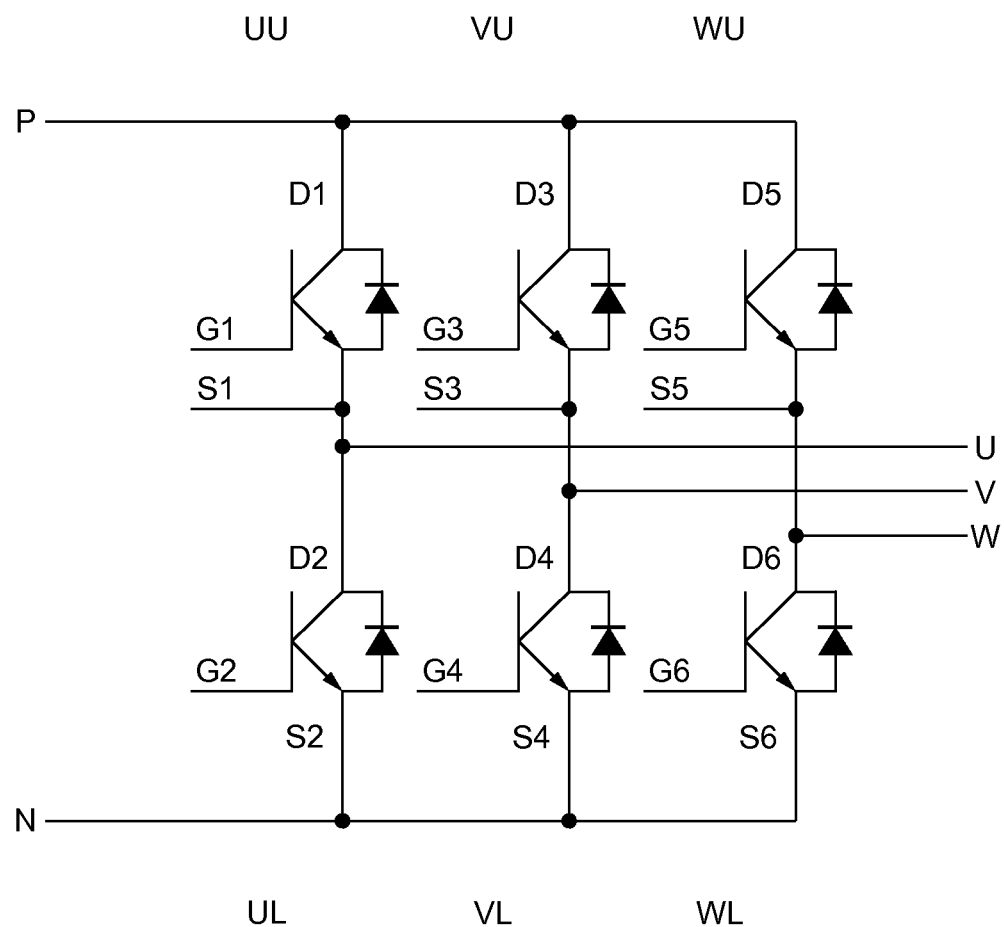
FIG. 4 is an equivalent circuit connection diagram of the semiconductor module in FIG. 1.
Figure 5:
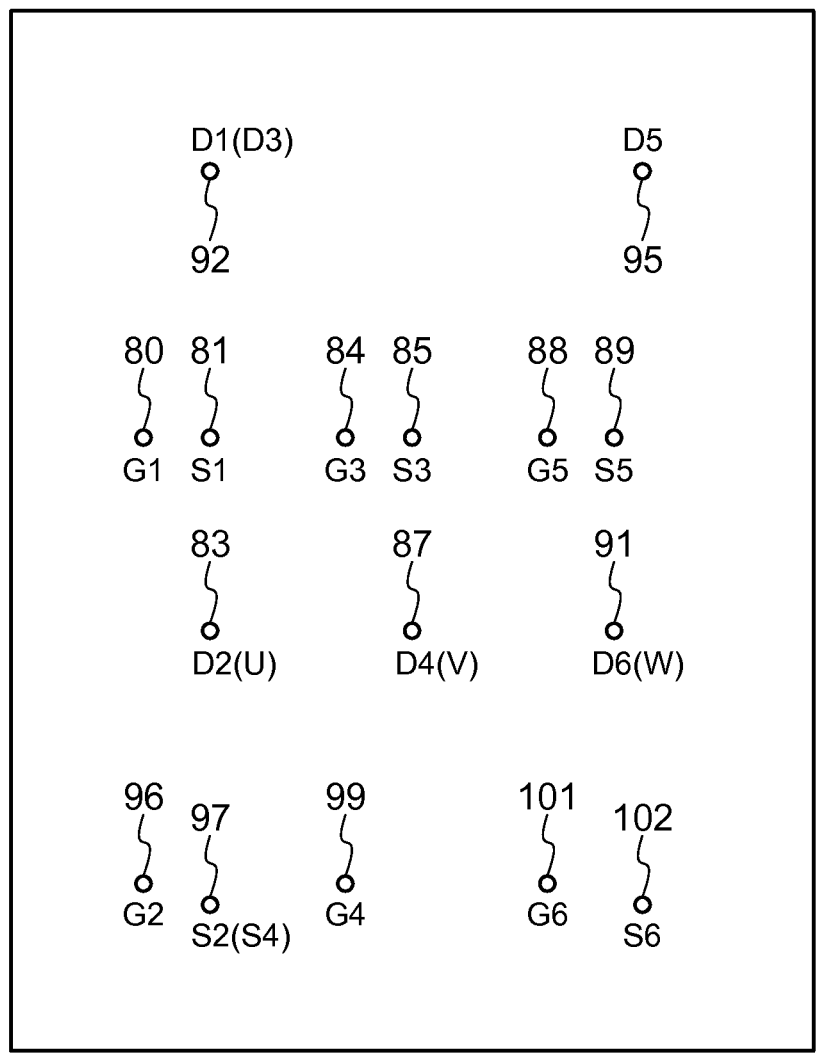
FIG. 5 is a view schematically showing arrangement of terminals of the semiconductor module in FIG. 1.

FIG. 4 is an equivalent circuit connection diagram of the semiconductor module in FIG. 1. FIG. 5 is a view schematically showing arrangement of the terminals of the semiconductor module in FIG. 1. As shown in FIG. 4 and FIG. 5, the semiconductor module 10 can function as a three-phase inverter module having a U-phase, a V-phase and a W-phase. In each of the circuit substrates 30, the transistor 32a is inverse-parallel connected to the diode 32b.

In the semiconductor module 10, by fitting the circuit substrates 30 with the base 20, a high positioning accuracy between the circuit substrates 30 and the base 20 can be obtained.

When the semiconductor element is mounted on the supporting substrate, a defective semiconductor element can occur due to a stress caused by mounting (dicing, die-bonding, wire bonding and the like). Since it is difficult to directly inspect the semiconductor element, the semiconductor element is generally inspected after being mounted on the supporting substrate. Here, if the plurality of semiconductor elements is supported by the single supporting substrate, when at least one defective semiconductor element is found in the inspection, all of the semiconductor elements supported by the supporting substrate become wasted. On the contrary, in the semiconductor module 10, it is possible to individually inspect the circuit substrates 30, select the non-defective circuit substrate 30, and selectively fit the selected non-defective circuit substrate 30 with the base 20. For this reason, as compared to the case where the plurality of semiconductor elements is supported by the single supporting substrate, the manufacturing yield of the semiconductor module 10 can be improved.

When the plurality of semiconductor elements is supported by the single supporting substrate, to prepare for the case where the defective semiconductor element is found, a space for mounting the new non-defective semiconductor element may be provided in the supporting substrate. In this case, the size of the supporting substrate increases. On the contrary, in the semiconductor module 10, each of the plurality of circuit substrates 30 has the supporting substrate 31 and the semiconductor element 32. For this reason, since the space for mounting the new non-defective semiconductor element is not required, the size of the semiconductor module 10 can be reduced. Further, in the semiconductor module 10, as compared to the case where the plurality of semiconductor elements is supported by the single supporting substrate, the size of each circuit substrate 30 can be reduced and thus, the circuit substrates 30 can be prevented from warping due to stress.

When the semiconductor module 10 includes the insulating support 40 supporting the terminals 80 to 91, since the terminals 80 to 91 and the insulating support 40 are integrated, assembling of the semiconductor module 10 is simplified.

When the semiconductor module 10 includes the base 20 having the groove 22, since the circuit substrates 30 can be slid along the groove 22 and be fitted with the base 20, assembling of the semiconductor module 10 is simplified.

<Method for Manufacturing Semiconductor Module>

With reference to FIG. 6 to FIG. 21, a method for manufacturing the semiconductor module 10 shown in FIGS. 1 to 3 will be described as an example of a method for manufacturing the semiconductor module in accordance with this embodiment. The semiconductor module 10 is manufactured as follows, for example.

(Providing Step of Circuit Substrate)

Figure 6:
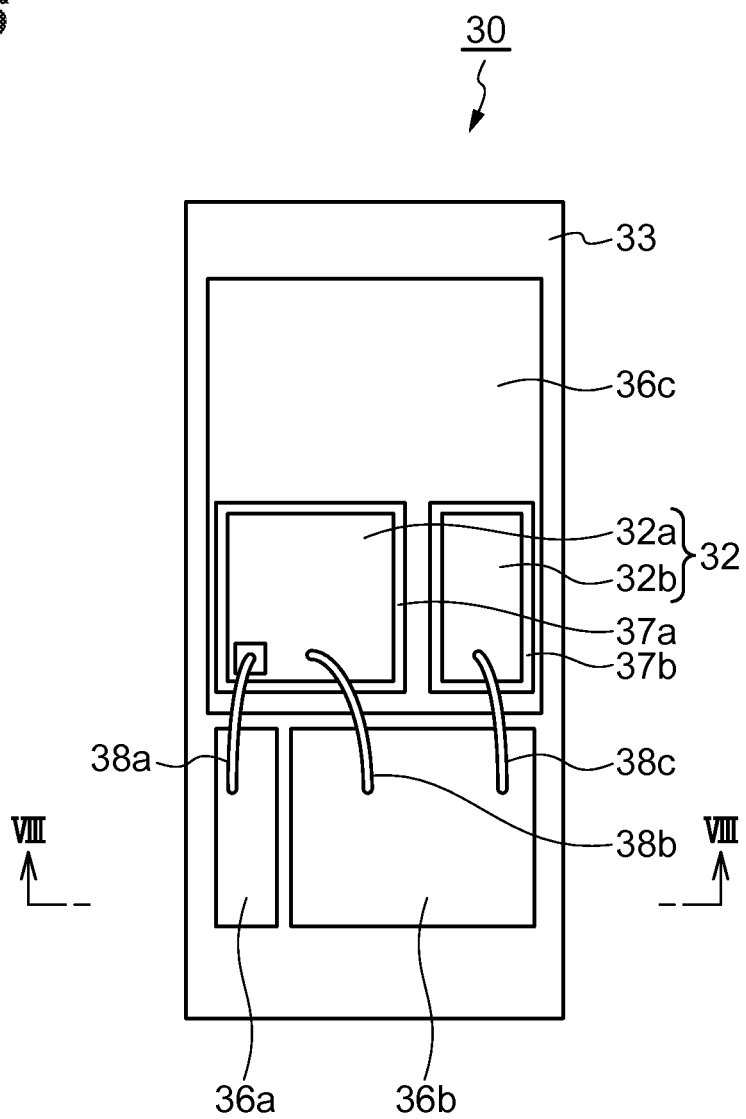
FIG. 6 is a plan view schematically showing a circuit substrate constituting the semiconductor module in FIG. 1.
Figure 7:
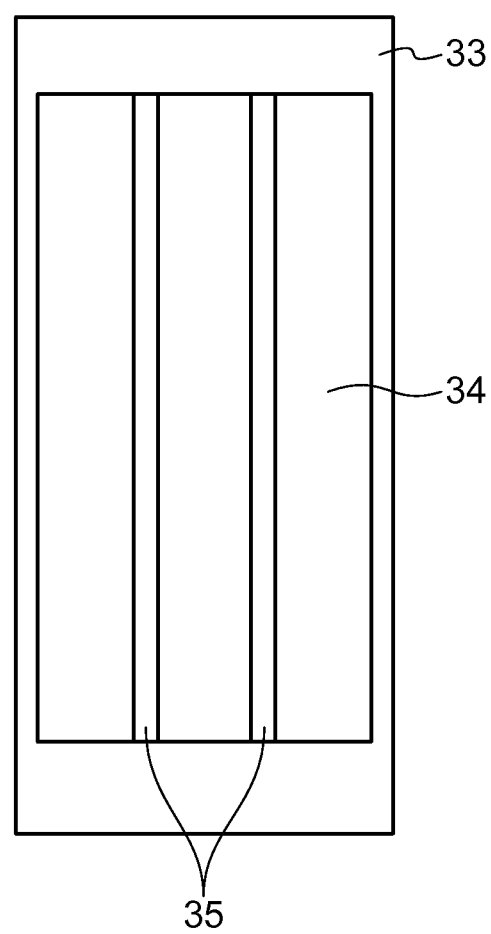
FIG. 7 is a plan view schematically showing a back surface of the circuit substrate in FIG. 6.
Figure 8:
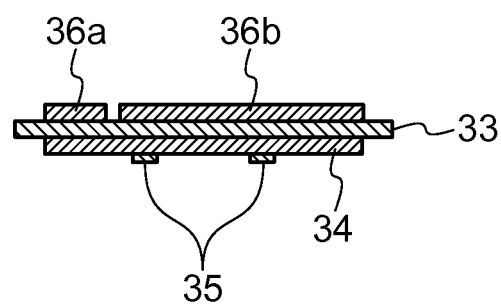
FIG. 8 is a sectional view showing the circuit substrate taken along a line VIII-VIII in FIG. 6.
Figure 9:
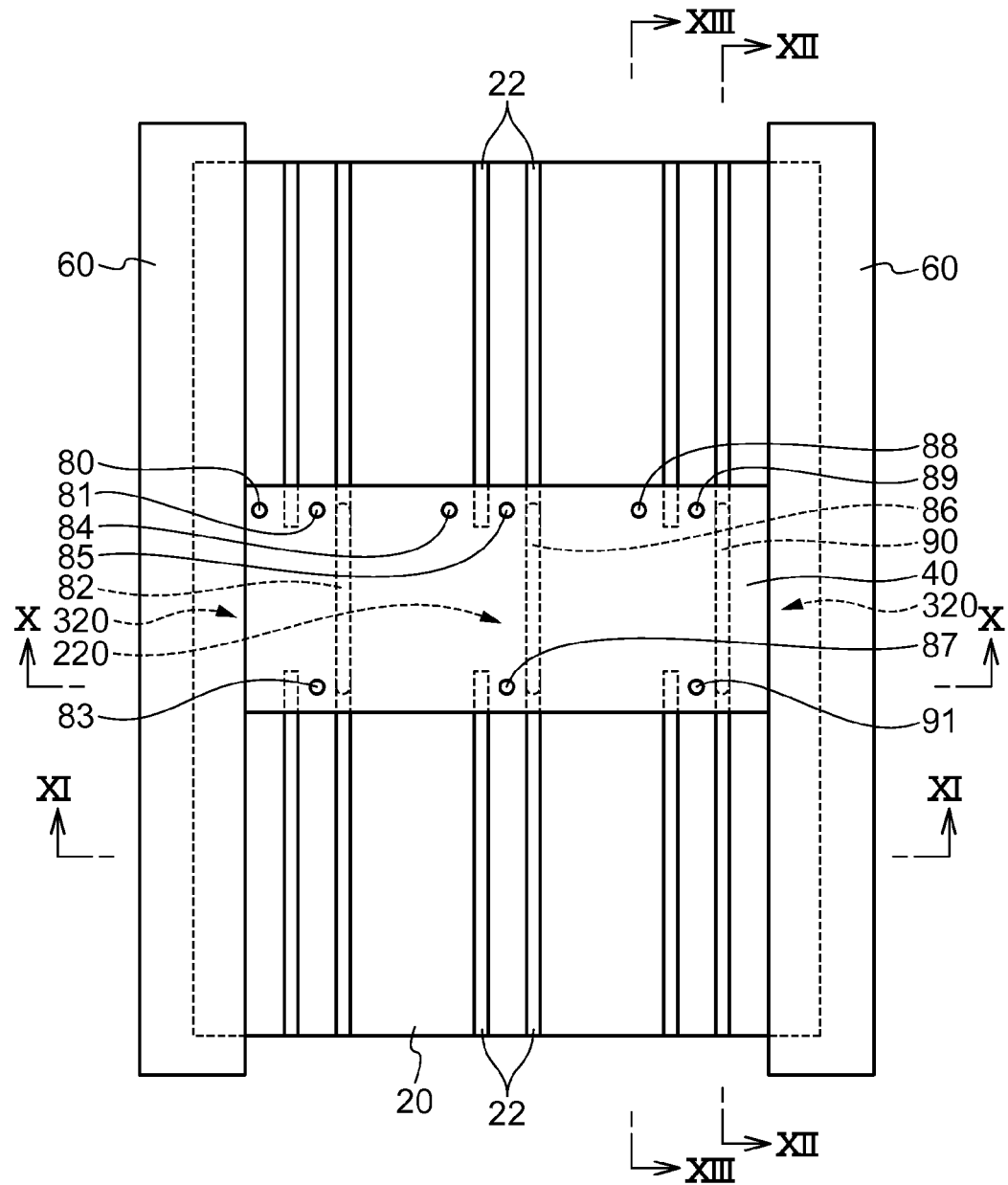
FIG. 9 is a plan view schematically showing a structure in a step of a method for manufacturing a semiconductor module in accordance with First embodiment.
Figure 10:
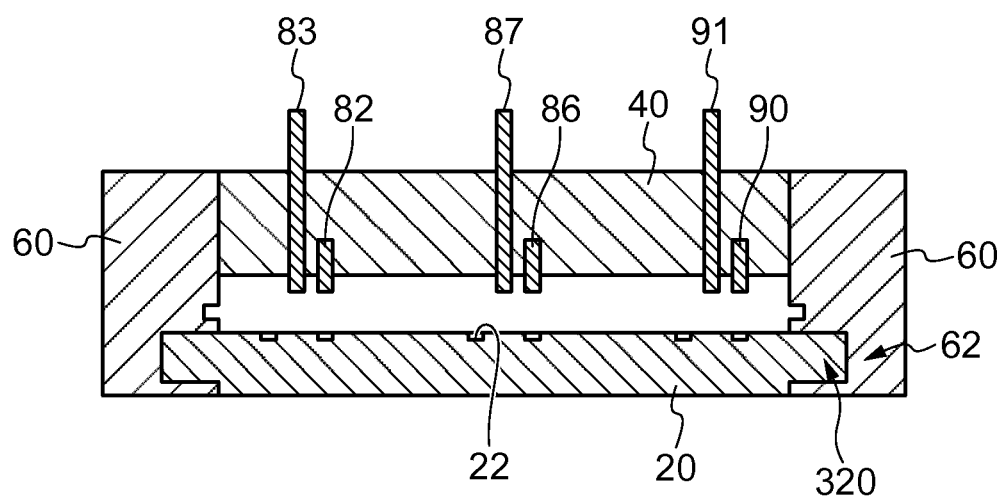
FIG. 10 is a sectional view showing the structure taken along a line X-X in FIG. 9.
Figure 11:
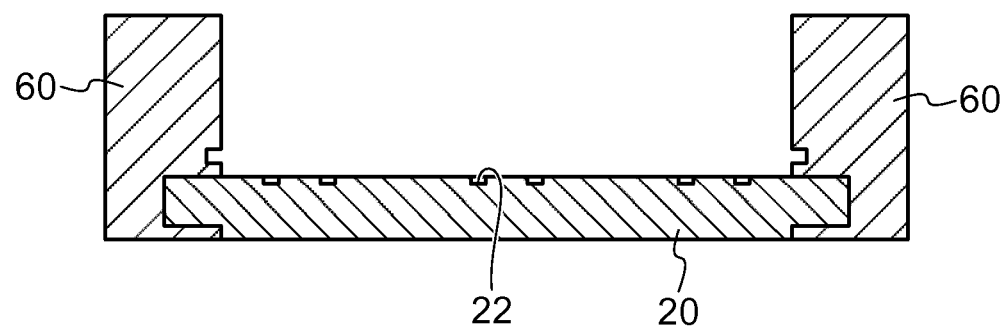
FIG. 11 is a sectional view showing the structure taken along a line XI-XI in FIG. 9.
Figure 12:
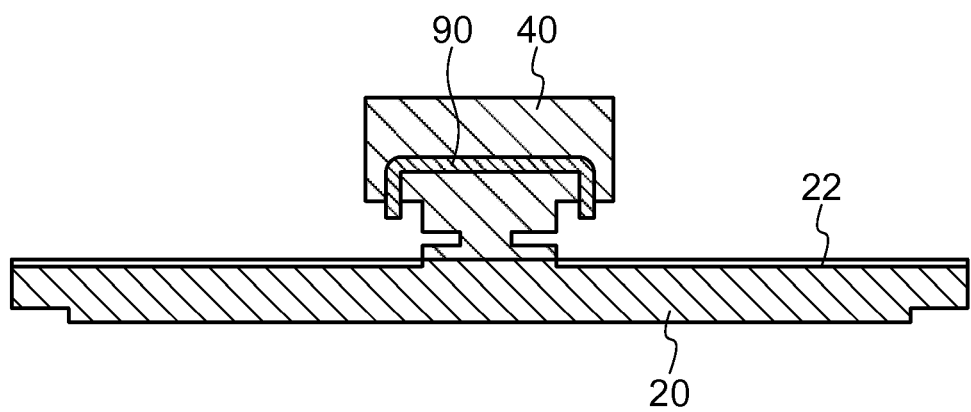
FIG. 12 is a sectional view showing the structure taken along a line XII-XII in FIG. 9.
Figure 13:
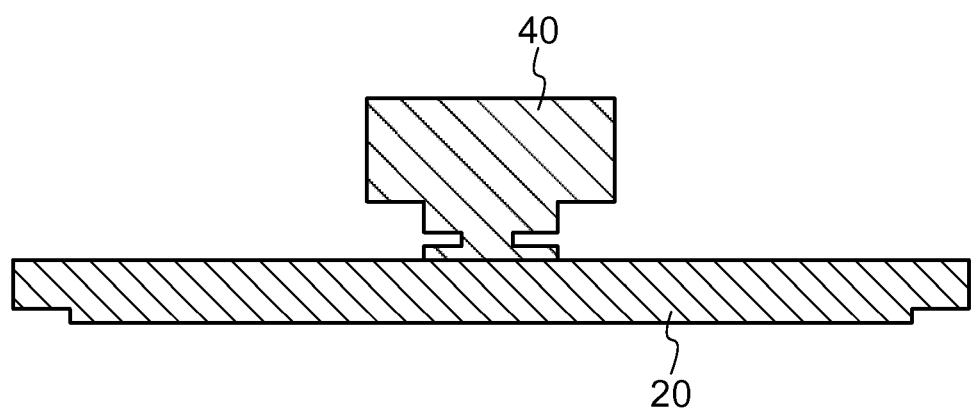
FIG. 13 is a sectional view showing the structure taken along a line XIII-XIII in FIG. 9.

First, as shown in FIG. 6 to FIG. 8, the circuit substrate 30 is provided. The protrusion 35 of the circuit substrate 30 is formed as follows, for example. First, a metal film is formed on the metal layer 34 provided on a surface opposite to the main surface of the insulating substrate 33. Next, the protrusion 35 is formed by etching the metal film according to lithography.

The circuit substrates 30 can be inspected by an electrical test or the like as needed. Through the inspection, the non-defective circuit substrate 30 is selected.

(Attaching Step of the First Insulating Support)

Next, as shown in FIG. 9 to FIG. 13, the insulating support 40 is attached to the base 20. The insulating support 40 can be attached such that the terminals 80 to 91 are arranged opposed to the grooves 22 of the base 20. The insulating support 40 is formed by pressing the terminals 80 to 91 into resin and molding the resin. Further, the insulating support 60 may be attached to the base 20. The grooves 22 of the base 20 can be formed by etching the base according to lithography.

(Fitting Step of Circuit Substrates)

Figure 14:
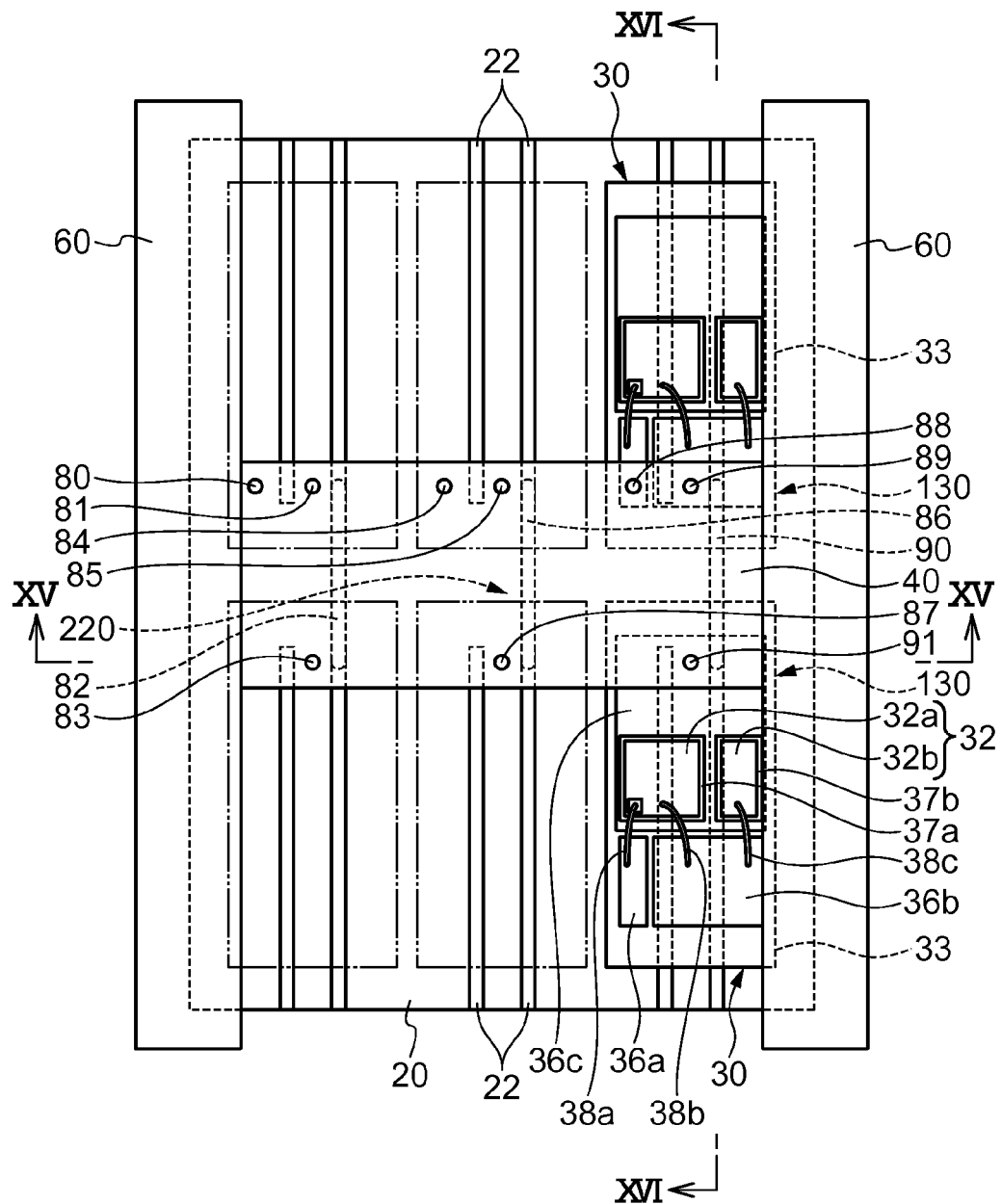
FIG. 14 is a plan view schematically showing a structure in a step of a method for manufacturing a semiconductor module in accordance with First embodiment.
Figure 15:
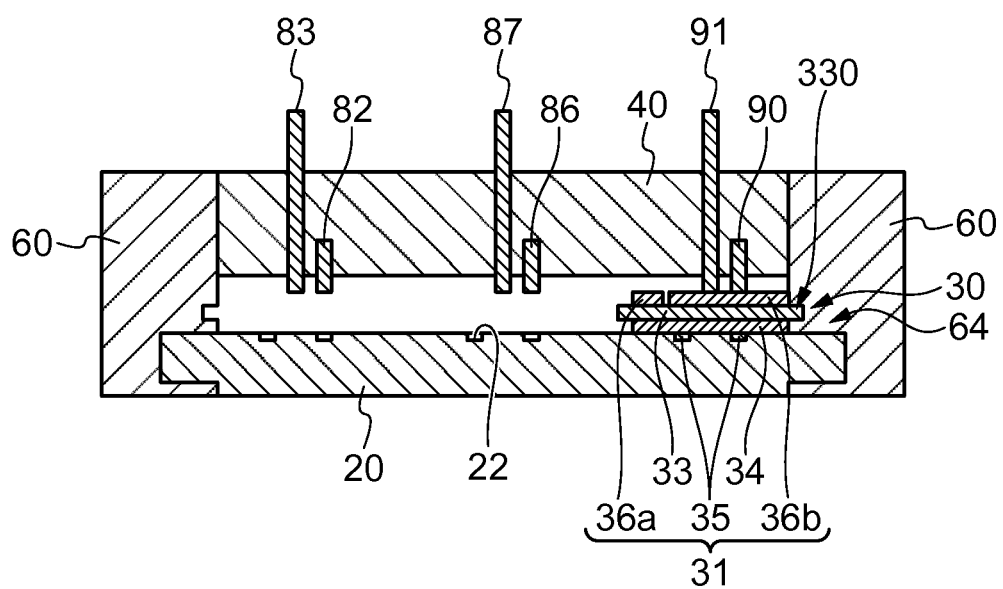
FIG. 15 is a sectional view showing the structure taken along a line XV-XV in FIG. 14.
Figure 16:
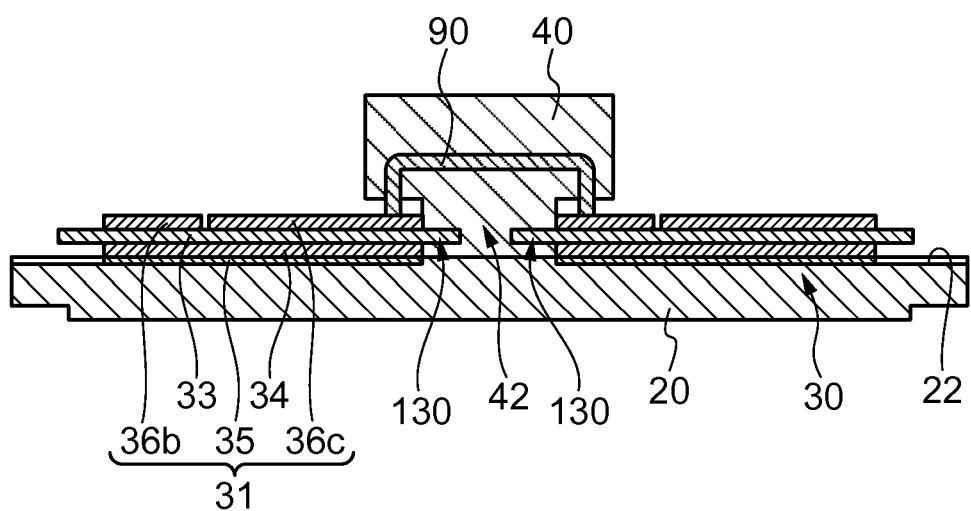
FIG. 16 is a sectional view showing the structure taken along a line XVI-XVI in FIG. 14.
Figure 17:
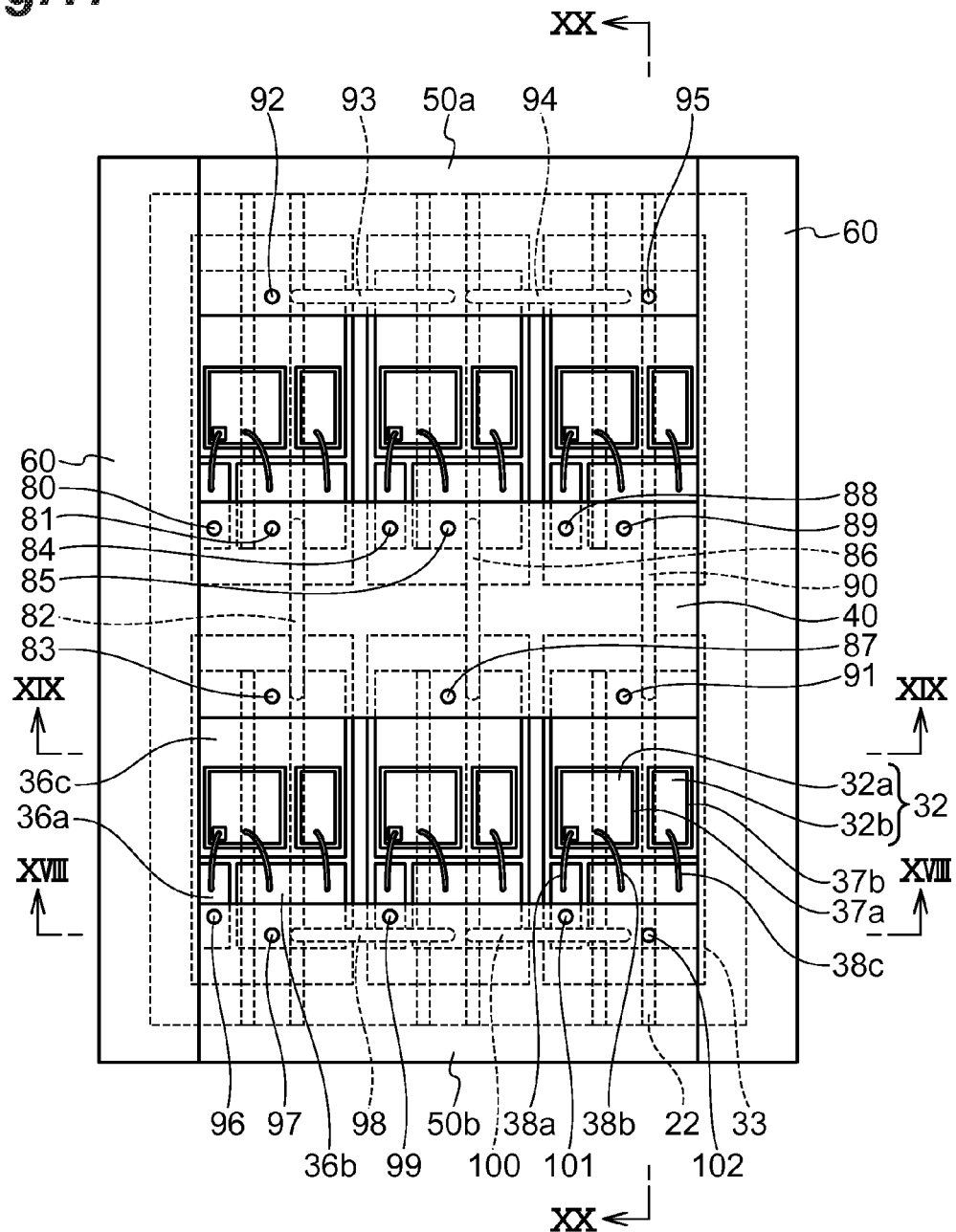
FIG. 17 is a plan view schematically showing a structure in a step of a method for manufacturing a semiconductor module in accordance with First embodiment.
Figure 18:
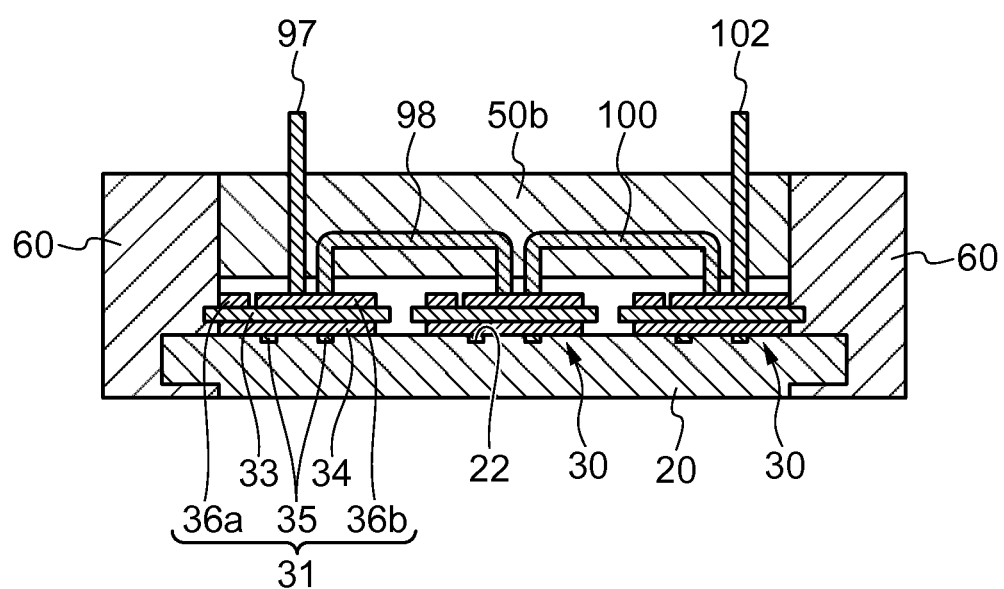
FIG. 18 is a sectional view showing the structure taken along a line XVIII-XVIII in FIG. 17.
Figure 19:
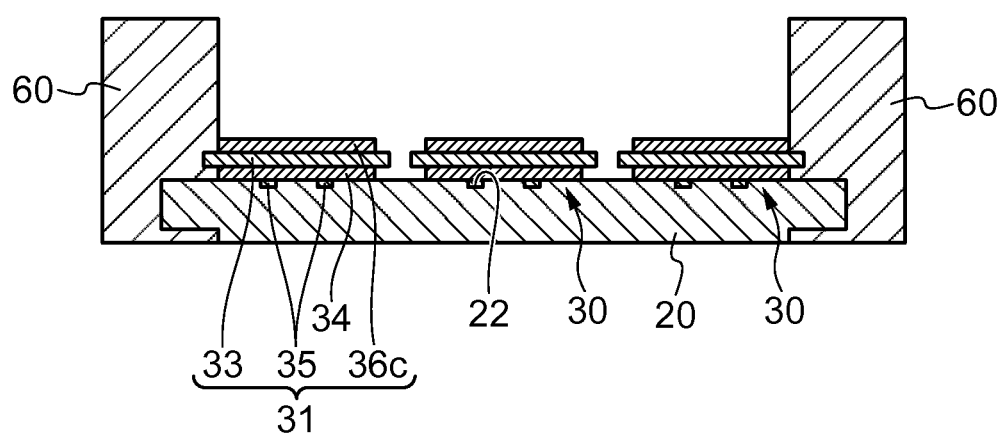
FIG. 19 is a sectional view showing the structure taken along a line XIX-XIX in FIG. 17.
Figure 20:
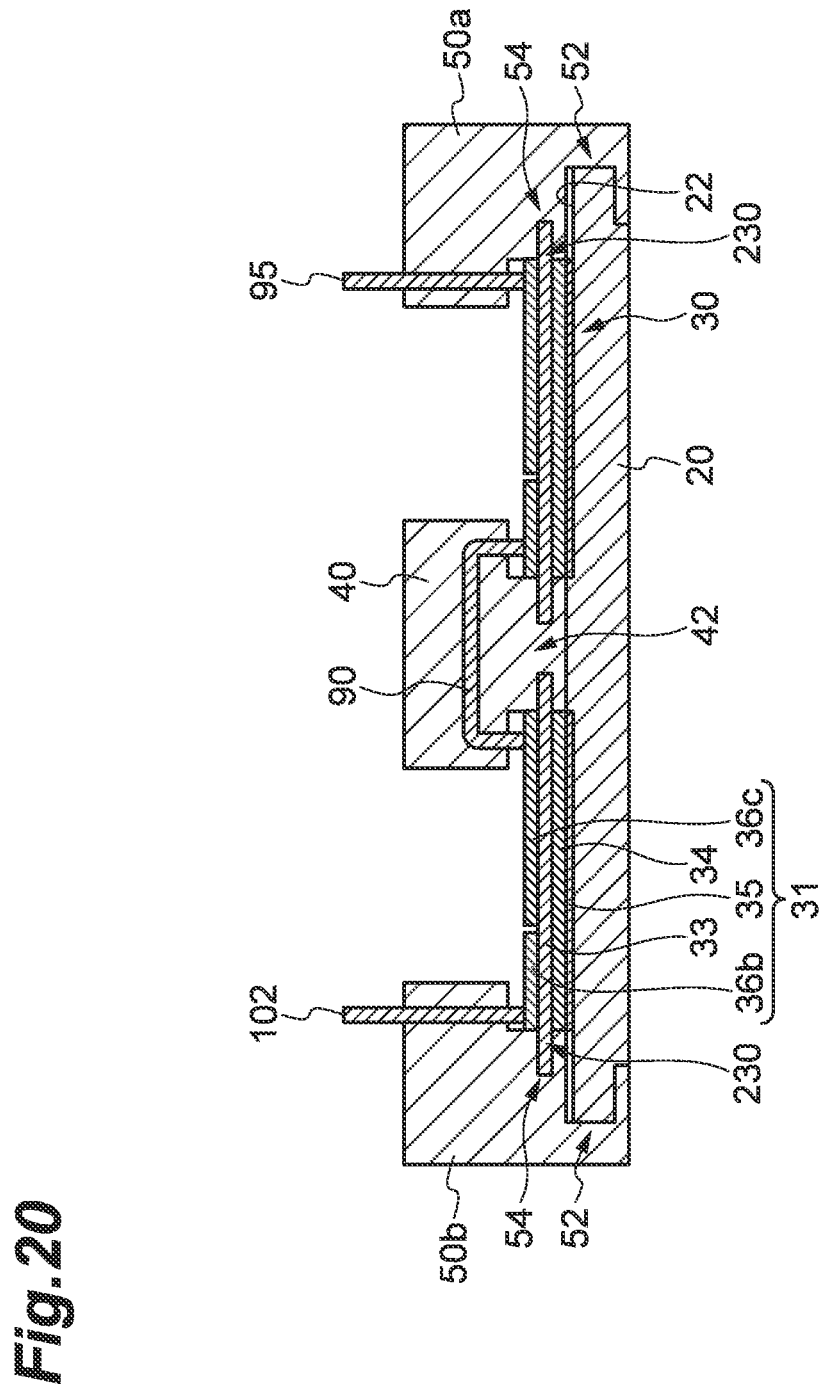
FIG. 20 is a sectional view showing the structure taken along a line XX-XX in FIG. 17.

Next, as shown in FIG. 14 to FIG. 16, the circuit substrates 30 are fitted with the base 20. The protrusions 35 of the circuit substrates 30 can be fitted with the grooves 22 of the base 20. For example, by causing the circuit substrates 30 to slide along the grooves 22 of the base 20 from the end 120 of the base 20 toward the central portion 220 in the state where the protrusion 35 are fitted with the grooves 22, the first ends 130 of the circuit substrates 30 are inserted between the terminals 80 to 91 and the base 20. Thereby, the electrode pads 36a, 36b, 36c of the semiconductor element 32 contact the terminals 80 to 91 and are electrically connected thereto.

(Attaching Step of the Second Insulating Support)

Next, as shown in FIG. 17 to FIG. 20, the insulating supports 50a, 50b are attached to the base 20. The insulating supports 50a, 50b are formed by pressing the terminals 92 to 102 into resin and molding the resin. Thereby, the ends 230 of the circuit substrates 30 can be fixed to the base 20. Further, the electrode pads 36a, 36b, 36c of the semiconductor element 32 contact the terminals 92 to 102, and are electrically connected thereto.

(Adhering Step of Cover)

Figure 21:
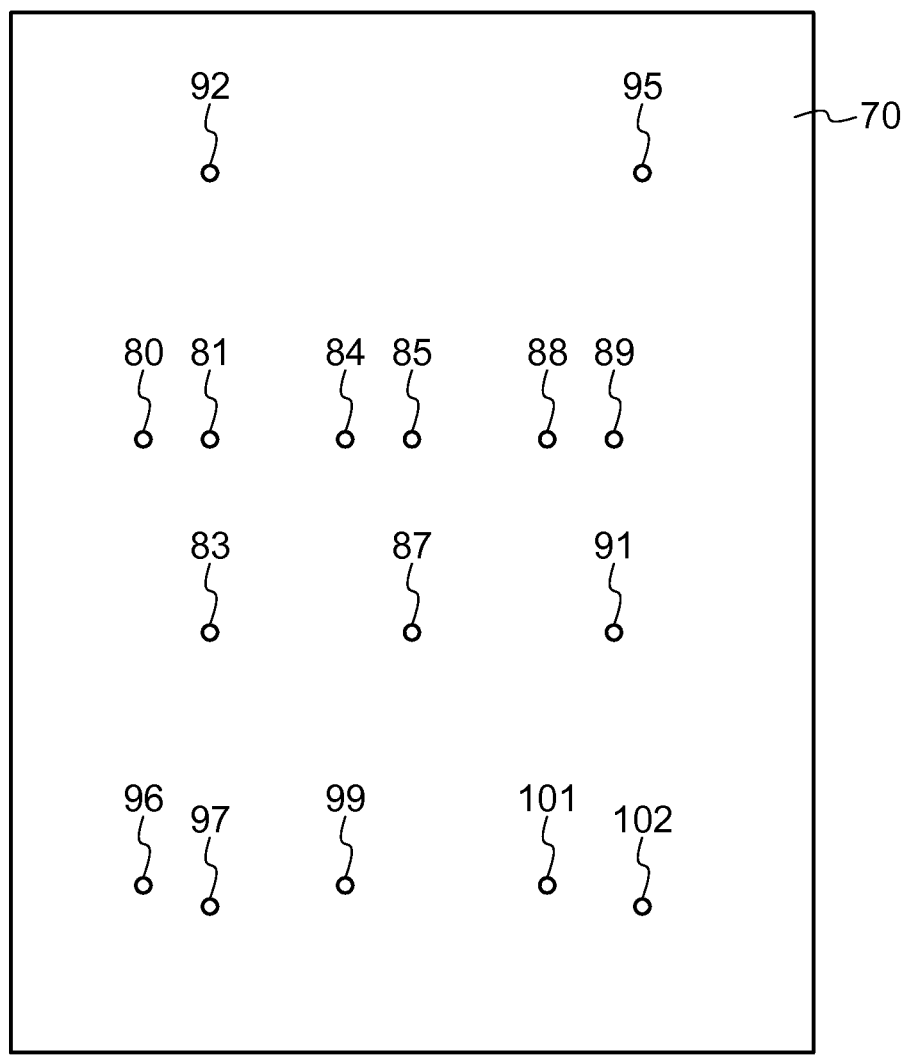
FIG. 21 is a plan view schematically showing a cover of the semiconductor module in accordance with First embodiment.

Next, as shown in FIG. 21, the cover 70 is attached to the insulating supports 40, 50a, 50b, 60. The cover 70 seals a space surrounded by the base 20 and the insulating supports 40, 50a, 50b, 60.

The order of the above-mentioned steps may be changed, or the plurality of steps may be performed at the same time. For example, the fitting step of the circuit substrates may be performed before the attaching step of the first insulating support. Further, the providing step of the circuit substrate may be performed after the attaching step of the first insulating support. Further, the fitting step of the circuit substrate and the attaching step of the second insulating support may be performed at the same time.

According to the above-mentioned method for manufacturing the semiconductor module, by fitting the circuit substrates 30 with the base 20, the semiconductor module 10 having a high positioning accuracy between the circuit substrates 30 and the base 20 can be obtained.

Second Embodiment

Figure 22:
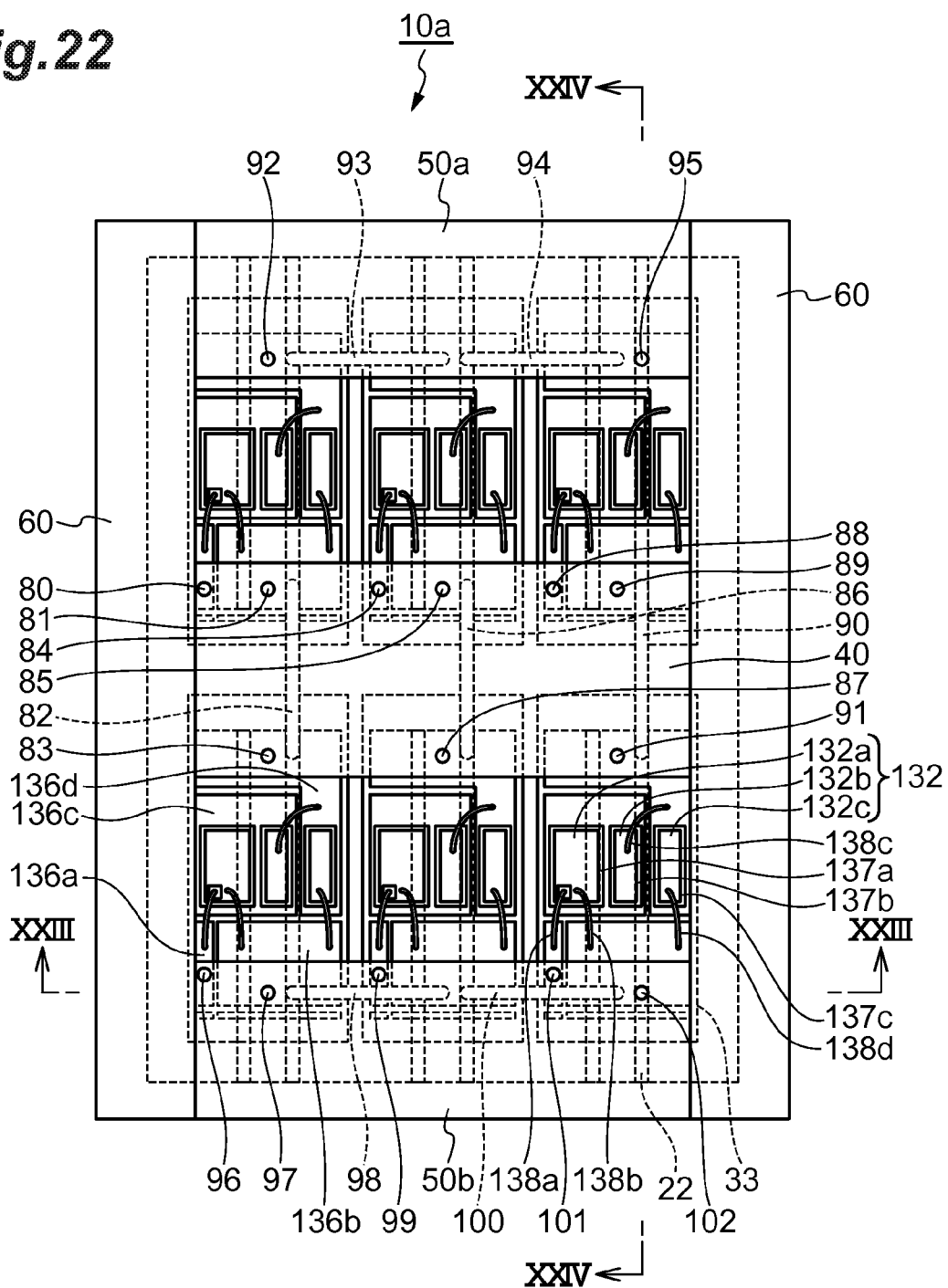
FIG. 22 is a plan view schematically showing a semiconductor module in accordance with Second embodiment.
Figure 23:
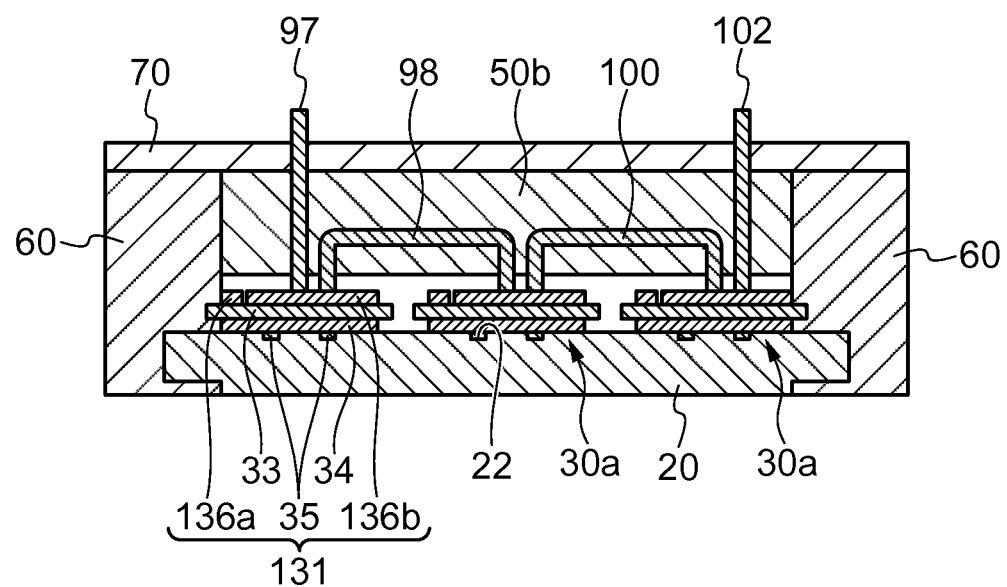
FIG. 23 is a sectional view showing the semiconductor module taken along a line XXIII-XXIII in FIG. 22.
Figure 24:
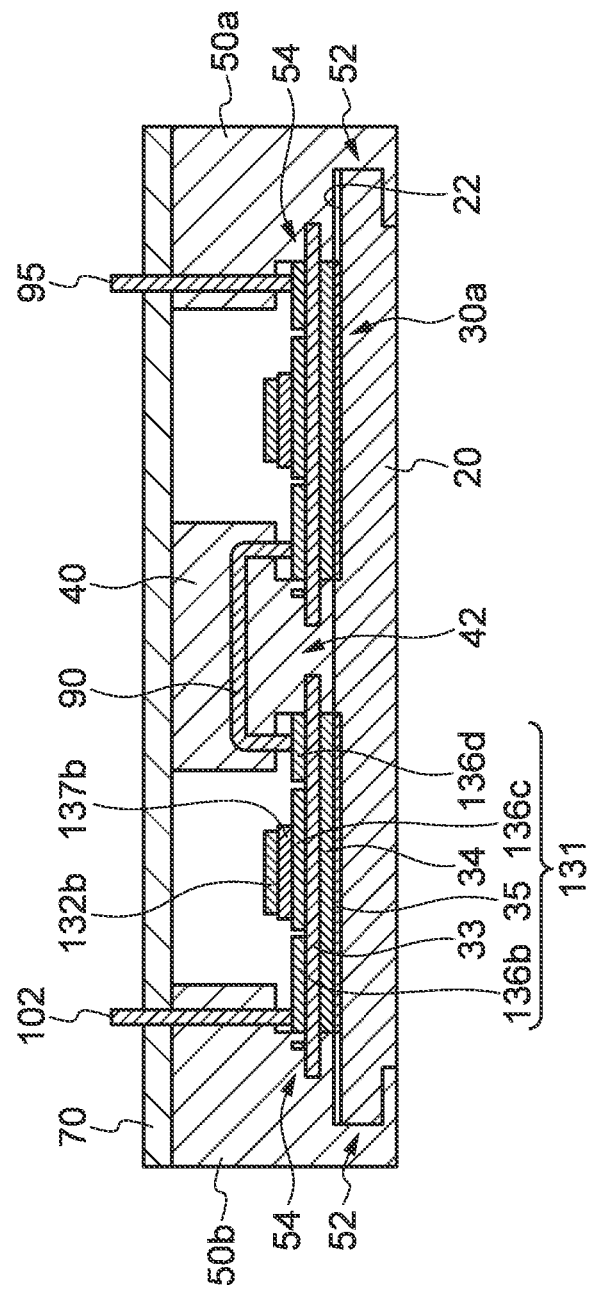
FIG. 24 is a sectional view showing the semiconductor module taken along a line XXIV-XXIV in FIG. 22.

FIG. 22 is a plan view schematically showing a semiconductor module in accordance with Second embodiment. FIG. 23 is a sectional view showing the semiconductor module taken along a line XXIII-XXIII in FIG. 22. FIG. 24 is a sectional view showing the semiconductor module taken along a line XXIV-XXIV in FIG. 22. In FIG. 22, the cover 70 is not shown for convenience.

Figure 26:
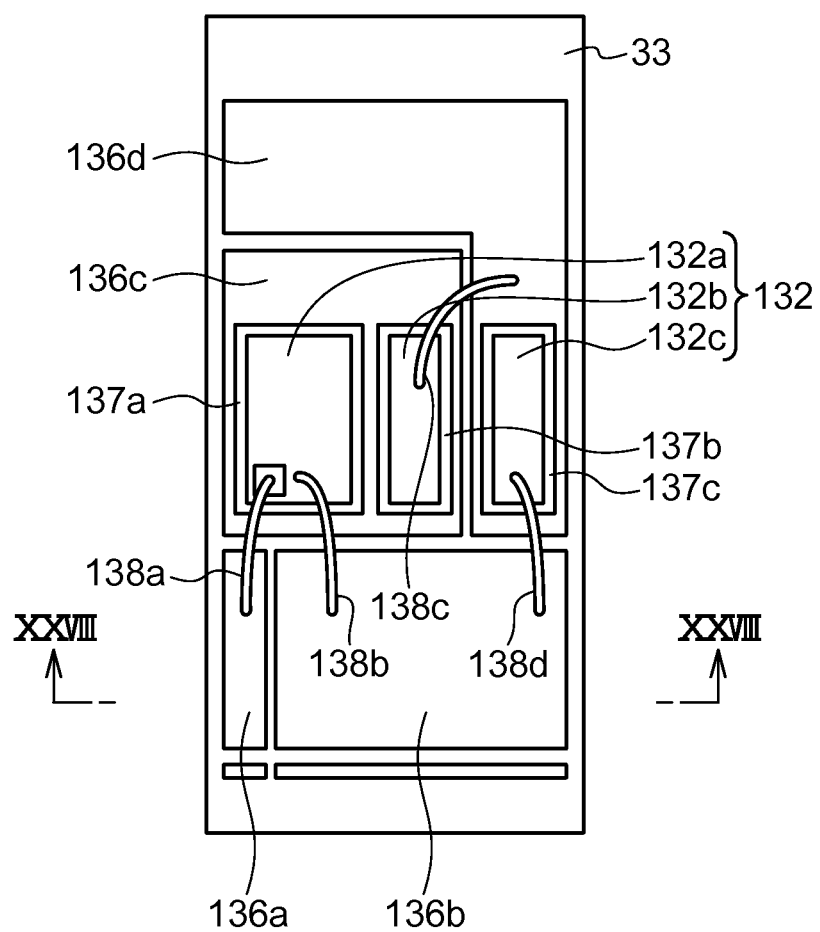
FIG. 26 is a plan view schematically showing a circuit substrate constituting the semiconductor module in FIG. 22.
Figure 27:
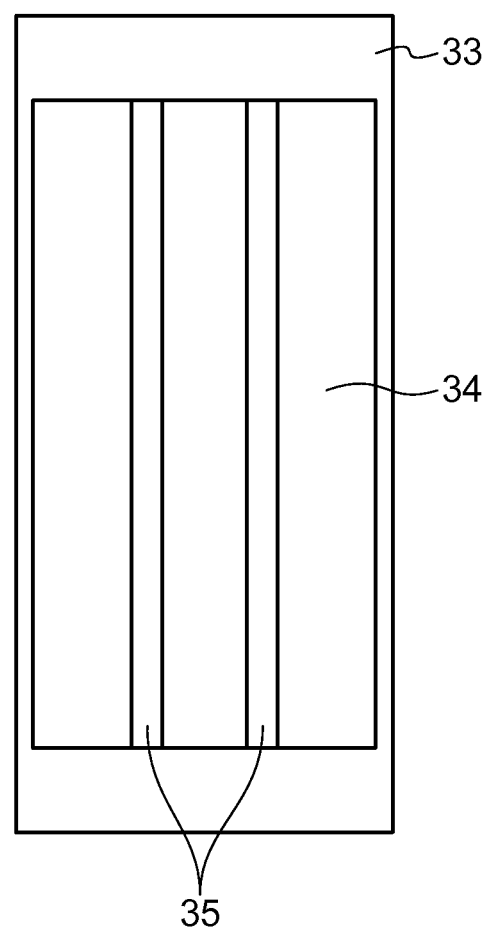
FIG. 27 is a plan view schematically showing a back surface of the circuit substrate in FIG. 26.
Figure 28:
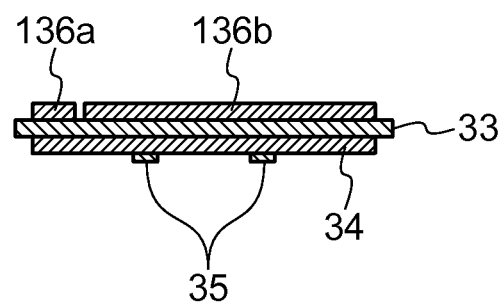
FIG. 28 is a sectional view showing the circuit substrate taken along a line XXVIII-XXVIII in FIG. 26.

A semiconductor module 10a shown in FIGS. 22 to 23 has the same configuration as the semiconductor module 10 except that circuit substrates 30a are provided in place of the circuit substrates 30. Each of the circuit substrates 30a has a supporting substrate 131 and a semiconductor element 132 supported by the supporting substrate 131 (refer to FIG. 26 to FIG. 28).

The supporting substrate 131 can include the insulating substrate 33, electrode pads 136a, 136b, 136c, 136d provided on the main surface of the insulating substrate 33, and the metal layer 34 provided on a surface opposite to the main surface of the insulating substrate 33.

The semiconductor element 132 can include a transistor 132a, a diode 132b, and a diode 132c. The transistor 132a is electrically connected to the electrode pad 136c via a solder 137a. The diode 132b is electrically connected to the electrode pad 136c via a solder 137b. A gate of the transistor 132a is electrically connected to the electrode pad 136a via a wire 138a. The diode 132c is electrically connected to the electrode pad 136d via a solder 137c. A source of the transistor 132a is electrically connected to the electrode pad 136b via a wire 138b. The diode 132b is electrically connected to the electrode pad 136d via a wire 138c. The diode 132c is electrically connected to the electrode pad 136b via a wire 138d.

Figure 25:
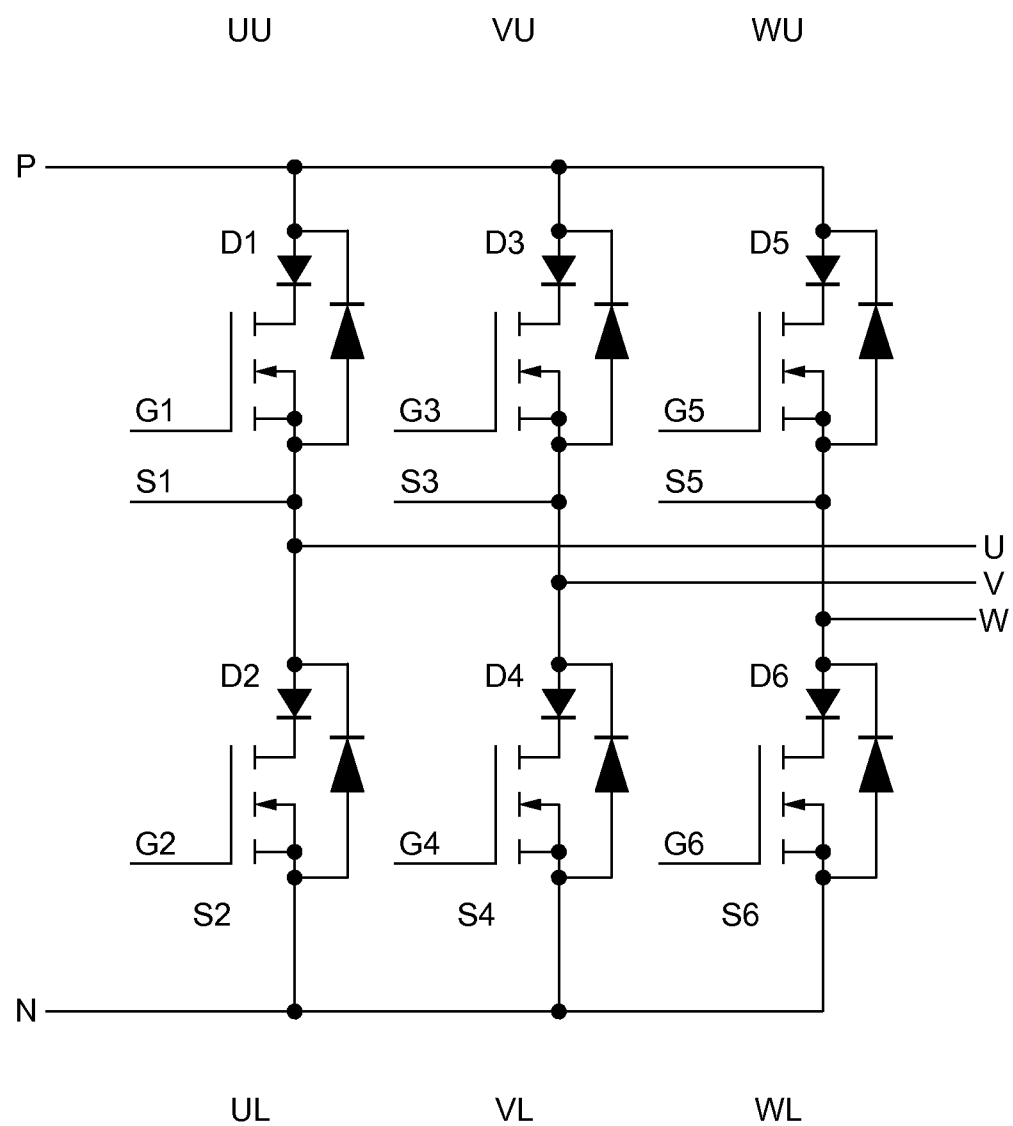
FIG. 25 is an equivalent circuit connection diagram of the semiconductor module in FIG. 22.

FIG. 25 is an equivalent circuit connection diagram of the semiconductor module in FIG. 22. Arrangement of the terminals of the semiconductor module 10a is the same as that of the terminals of the semiconductor module 10 in FIG. 5. As shown in FIG. 5 and FIG. 25, the semiconductor module 10a can function as a three-phase inverter module having a U-phase, a V-phase and a W-phase. In each of the circuit substrates 30, the transistor 132a is an MOSFET, the diode 132b is serially connected to the transistor 132a, and the diode 132c is inverse-parallel connected to both ends of the transistor 132a and the diode 132b. The diode 132b can suppress the operation of a parasitic diode in the MOSFET.

The semiconductor module 10a can achieve the same effects as the semiconductor module 10. Further, the semiconductor module 10a can be manufactured in the same method as the method for manufacturing the semiconductor module 10.

Third Embodiment

Figure 29:
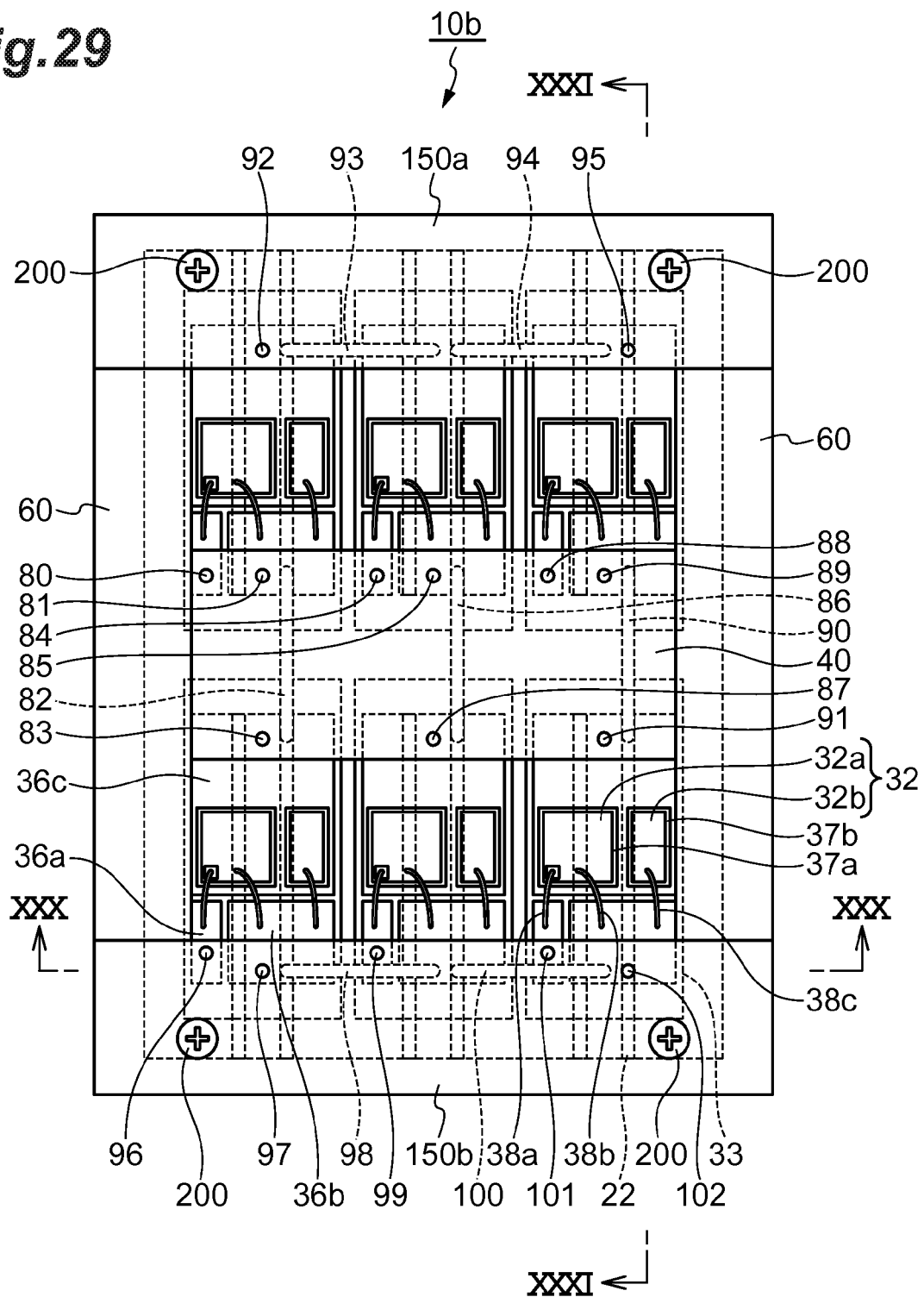
FIG. 29 is a plan view schematically showing a semiconductor module in accordance with Third embodiment.
Figure 30:
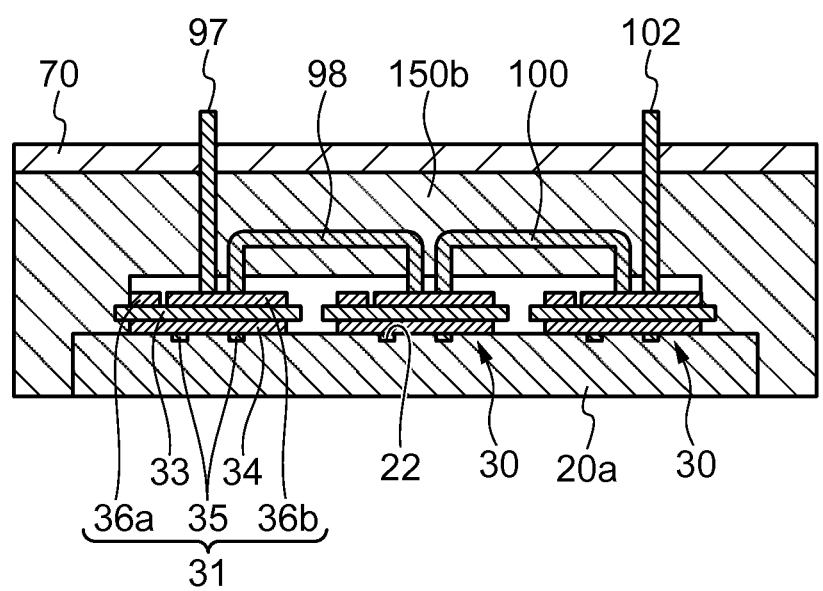
FIG. 30 is a sectional view showing the semiconductor module taken along a line XXX-XXX in FIG. 29.
Figure 31:
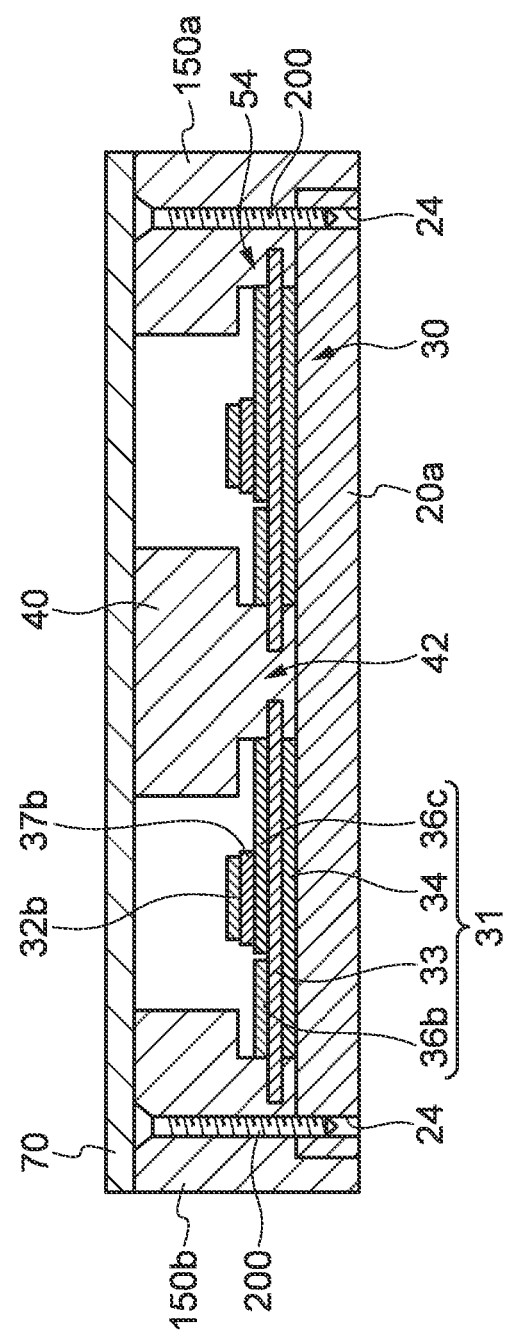
FIG. 31 is a sectional view showing the semiconductor module taken along a line XXXI-XXXI in FIG. 29.

FIG. 29 is a plan view schematically showing a semiconductor module in accordance with Third embodiment. FIG. 30 is a sectional view showing the semiconductor module taken along a line XXX-XXX in FIG. 29. FIG. 31 is a sectional view showing the semiconductor module taken along a line XXXI-XXXI in FIG. 29. In FIG. 29, the cover 70 is not shown for convenience.

A semiconductor module 10b shown in FIGS. 29 to 31 has the same configuration as the semiconductor module 10 except that insulating supports 150a, 150b are provided in place of the insulating supports 50a, 50b, a base 20a is provided in place of the base 20, and screws 200 as the fixing member are further provided.

The base 20a has the same configuration as the base 20 except that threaded holes 24 are further provided. The insulating supports 150a, 150b have the same configuration as the insulating supports 50a, 50b except that they have no holding part 52 and the screws 200 are penetrated.

The screws 200 fix the circuit substrates 30 to the base 20a. The screws 200 fix the ends 230 of the circuit substrates 30 to the base 20a through the insulating supports 150a, 150b. In corners of the base 20, the screws 200 are attached to the respective threaded holes 24 of the base 20a through the insulating supports 150a, 150b.

The semiconductor module 10b can achieve the same effects as the semiconductor module 10. Further, the semiconductor module 10b can be manufactured in the same method as the method for manufacturing the semiconductor module 10. In this embodiment, the fitting step of the circuit substrates and the attaching step of the second insulating support are performed at the same time.

Figure 32:
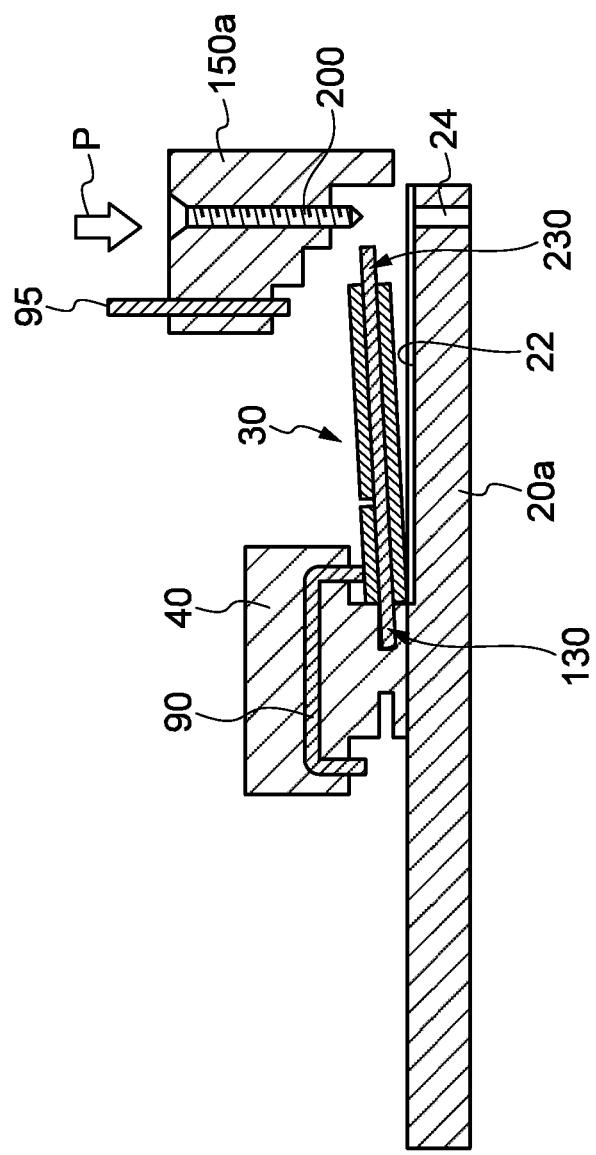
FIG. 32 is a plan view schematically showing a structure in a step of a method for manufacturing a semiconductor module in accordance with Third embodiment.

First, by causing the circuit substrates 30 to slide along the grooves 22 of the base 20 from the end 120 of the base 20 toward the central portion 220 in the state where the protrusions 35 are fitted with the grooves 22, the first ends 130 of the circuit substrates 30 are inserted between the terminals 80 to 91 and the base 20. After that, as shown in FIG. 32, by pressing the insulating supports 150a, 150b onto the base 20a with a pressure P, and attaching the screws 200 to the threaded holes 24, the ends 230 of the circuit substrates 30 are fixed to the base 20a. Thereby, the terminals 80 to 91 are electrically connected to the semiconductor element 32, and the circuit substrates 30 are fitted with the grooves 22 of the base 20a.

According to the method for manufacturing the semiconductor module 10b, when the ends 130 of the circuit substrates 30 are inserted between the terminals 80 to 91 and the base 20a, as shown in FIG. 32, even when the terminals 80 to 91 press the ends 130 and thus the ends 230 of the circuit substrates 30 float, the screws 200 can fit the circuit substrates 30 with the grooves 22 of the base 20a.

Figure 33:
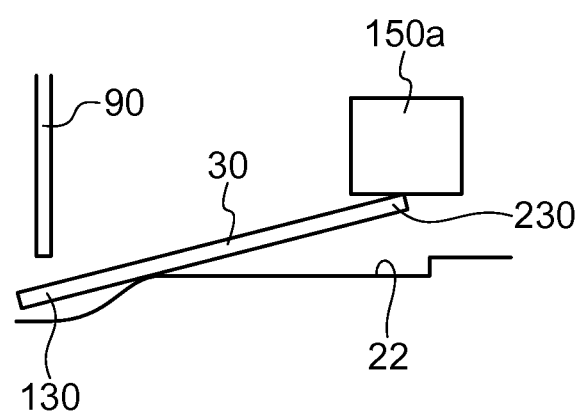
FIG. 33 is a view showing an example of a structure for fitting the circuit substrate with the base.

The grooves 22 each may, as shown in FIG. 33, become deeper along an extending direction of the groove 22. The whole or a part of the groove 22 may become gradually deeper along the extending direction of the groove 22, or become deeper along the extending direction of the groove 22 in a stepwise manner. The groove 22 becomes deeper toward the terminals 80 to 91. In this case, since a space between the terminals 80 to 91 and a bottom of the groove 22 can be kept wide, the end 130 of the circuit substrates 30 can be diagonally inserted. As a result, assembling of the semiconductor module 10b is simplified. Further, when the screws 200 fix the ends 230 of the circuit substrates 30 to the base 20a, electrical connection between the terminals 80 to 91 and the semiconductor element 32 can be achieved more reliably by the principle of leverage.

In addition, an adhesive as the fixing member may be used in place of the screws 200.

Fourth Embodiment

Figure 34:
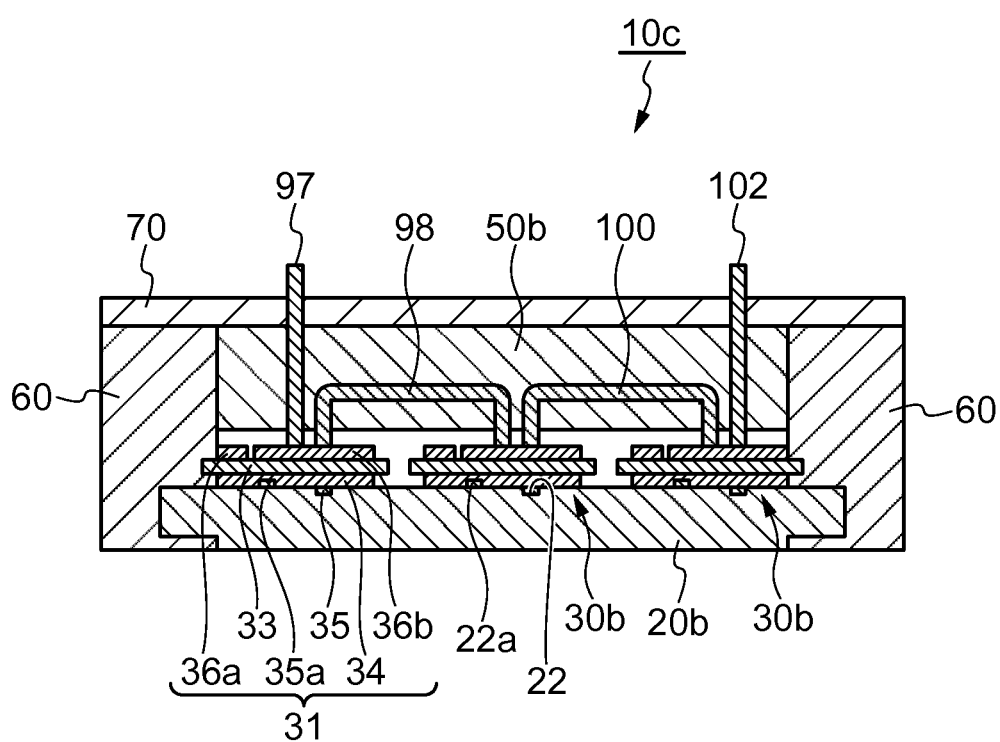
FIG. 34 is a sectional view schematically showing a semiconductor module in accordance with Fourth embodiment.

FIG. 34 is a sectional view schematically showing a semiconductor module in accordance with Fourth embodiment. The semiconductor module 10c shown in FIG. 34 has the same configuration as the semiconductor module 10 except that its structure for fitting the circuit substrates with the base is different. The semiconductor module 10c includes circuit substrates 30b and a base 20b.

Figure 35:
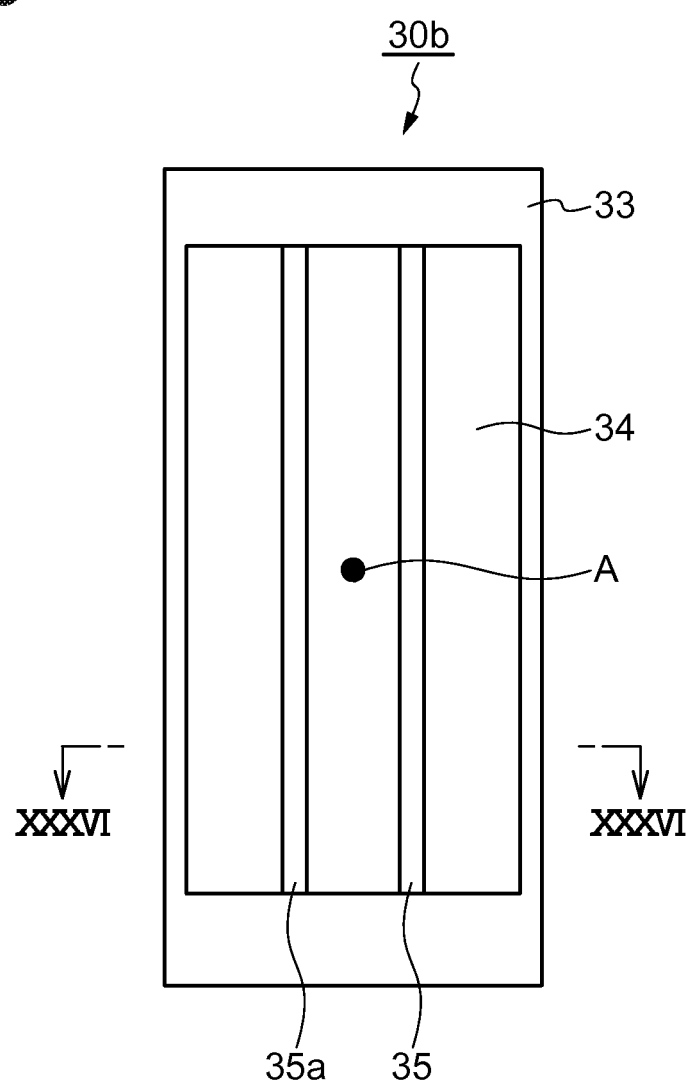
FIG. 35 is a plan view schematically showing a circuit substrate constituting the semiconductor module in FIG. 34.
Figure 36:
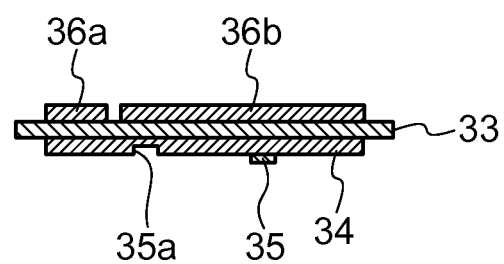
FIG. 36 is a sectional view showing the circuit substrate taken along a line XXXVI-XXXVI in FIG. 35.

Each of the circuit substrates 30b has the same configuration as the circuit substrate 30 except that it includes a recess 35a and a protrusion 35 (refer to FIG. 35 to FIG. 36). The recess 35a and the protrusion 35 are arranged on each side of an axis line A that passes the center (for example, the center of gravity) of the main surface of the circuit substrates 30b, and is perpendicular to the main surface. The structure for fitting the circuit substrate 30b with the base 20b is formed asymmetrically about the axis line A. The recess 35a can be formed by etching the metal layer 34. The base 20b has protrusions 22a fitted with the recesses 35a in addition to the grooves 22 fitted with the protrusions 35. The protrusion 22a can be formed by etching the base.

The semiconductor module 10c can achieve the same effects as the semiconductor module 10. Further, the semiconductor module 10c can be manufactured in the same method as the method for manufacturing the semiconductor module 10. Further, in the semiconductor module 10c, since the orientation of the circuit substrates 30b with respect to the base 20b is uniquely determined, the circuit substrates 30b can be prevented from being fitted with the base 20b with wrong orientation. As a result, assembling of the semiconductor module 10c is simplified.

Fifth Embodiment

Figure 37:
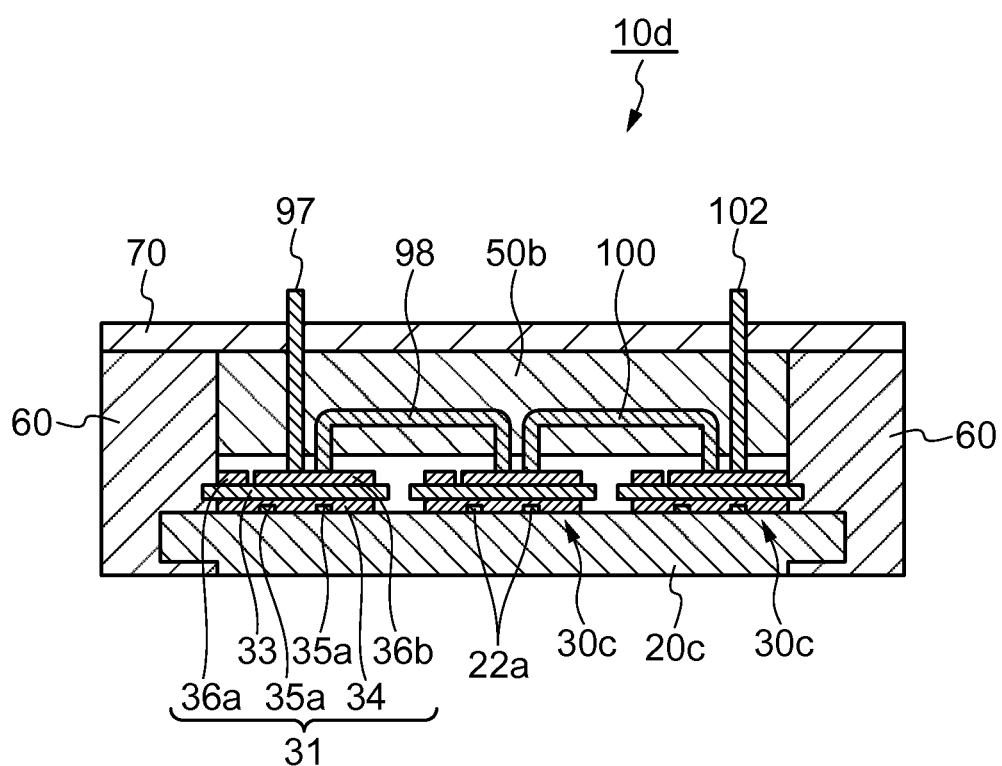
FIG. 37 is a sectional view schematically showing a semiconductor module in accordance with Fifth embodiment.

FIG. 37 is a sectional view schematically showing a semiconductor module in accordance with Fifth embodiment. A semiconductor module 10d shown in FIG. 37 has the same configuration as the semiconductor module 10 except that its structure for fitting the circuit substrates with the base is different. The semiconductor module 10d includes circuit substrates 30c and a base 20c. Each of the circuit substrates 30c includes the recess 35a formed on the metal layer 34. The base 20c includes protrusions 22a corresponding to the recesses 35a.

The semiconductor module 10d can achieve the same effects as the semiconductor module 10. Further, the semiconductor module 10d can be manufactured in the same method as the method for manufacturing the semiconductor module 10.

Sixth Embodiment

Figure 38:
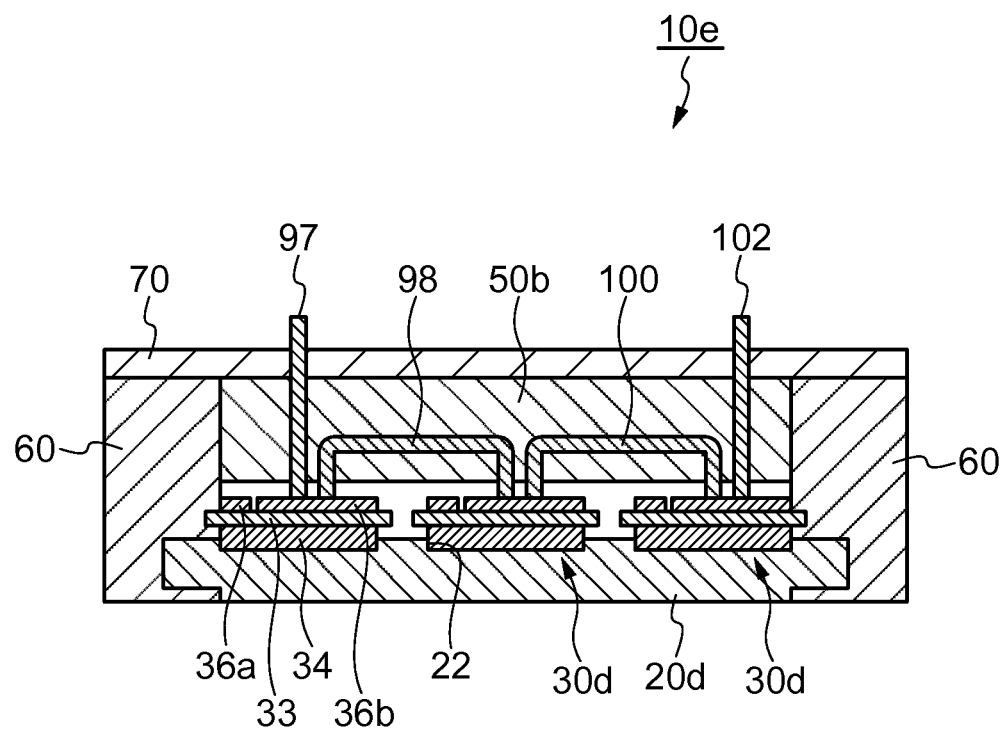
FIG. 38 is a sectional view schematically showing a semiconductor module in accordance with Sixth embodiment.

FIG. 38 is a sectional view schematically showing a semiconductor module in accordance with Sixth embodiment. A semiconductor module 10e shown in FIG. 38 has the same configuration as the semiconductor module 10 except that its structure for fitting the circuit substrate with the base is different. The semiconductor module 10e includes circuit substrates 30d and a base 20d. The circuit substrate 30d has no protrusion 35 and no recess 35a. The base 20d includes the groove 22 corresponding to the whole of the circuit substrate 30d.

The semiconductor module 10e can achieve the same effects as the semiconductor module 10. Further, the semiconductor module 10e can be manufactured in the same method as the method for manufacturing the semiconductor module 10.

Seventh Embodiment

Figure 39:
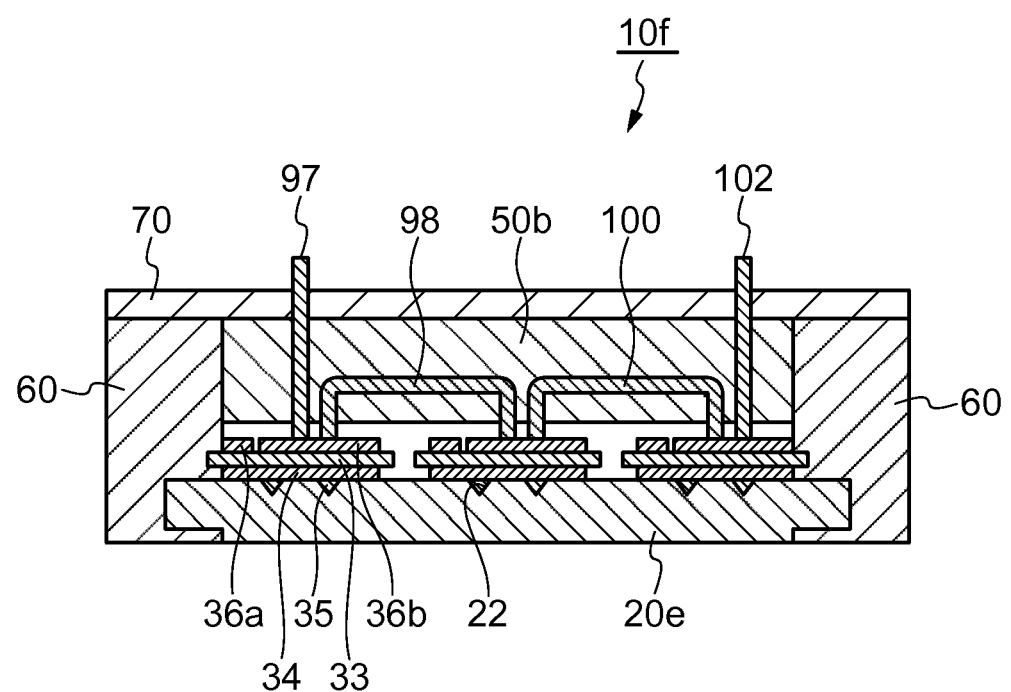
FIG. 39 is a sectional view schematically showing a semiconductor module in accordance with Seventh embodiment.

FIG. 39 is a sectional view schematically showing a semiconductor module in accordance with Seventh embodiment. A semiconductor module 10f shown in FIG. 39 has the same configuration as the semiconductor module 10 except that its different structure for fitting the circuit substrate with the base is different. The semiconductor module 10f includes circuit substrates 30e and a base 20e. In the circuit substrate 30e, the shape of a cross section of the protrusion 35, which is perpendicular to its extending direction, is triangular. For this reason, in the base 20e, the shape of a cross section of the groove 22, which is perpendicular to its extending direction, is also triangular.

The semiconductor module 10f can achieve the same effects as the semiconductor module 10. Further, the semiconductor module 10f can be manufactured in the same method as the method for manufacturing the semiconductor module 10.

Eighth Embodiment

Figure 40:
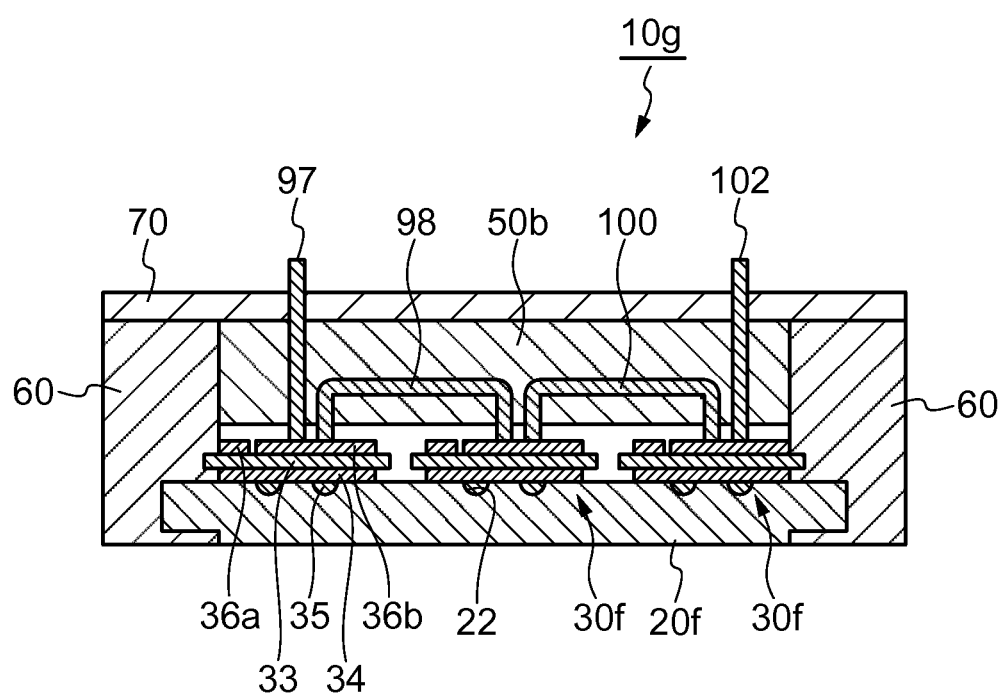
FIG. 40 is a sectional view schematically showing a semiconductor module in accordance with Eighth embodiment.

FIG. 40 is a sectional view schematically showing a semiconductor module in accordance with Eighth embodiment. A semiconductor module 10g shown in FIG. 40 has the same configuration as the semiconductor module 10 except that its different structure for fitting the circuit substrate with the base is different. The semiconductor module 10g includes circuit substrates 30f and a base 20f. In the circuit substrates 30f, the shape of a cross section of the protrusion 35, which is perpendicular to its extending direction, is semi-circular. For this reason, in the base 20f, the shape of a cross section of the groove 22, which is perpendicular to its extending direction, is also semi-circular.

The semiconductor module 10g can achieve the same effects as the semiconductor module 10. Further, the semiconductor module 10g can be manufactured in the same method as the method for manufacturing the semiconductor module 10.

Although the preferred embodiments of the present invention have been described in detail, the present invention is not limited to the above-mentioned embodiments. The configurations of the semiconductor modules in accordance with First to Eighth embodiments may be combined with each other. The base may include the recess, and the supporting substrate may include the protrusion corresponding to the recess. The base may include the protrusion, and the supporting substrate may include the recess corresponding to the protrusion. The base may include the recess, and the supporting substrate may be directly fitted with the recess. The structure for fitting the circuit substrate with the base may be any shape of recess, groove, protrusion, rail and the like.

What is claimed is:

1. A semiconductor module comprising:
    a base; and
    at least one circuit substrate, wherein
    the at least one circuit substrate includes a supporting substrate and a semiconductor element supported by the supporting substrate, wherein
    the base and/or the supporting substrate has a structure for fitting a main surface of the at least one circuit substrate with the base, the main surface facing the base, and
    wherein the semiconductor element includes a wide bandgap semiconductor.

2. The semiconductor module according to claim 1, wherein
    the at least one circuit substrate includes a plurality of the circuit substrates, and
    each of the plurality of circuit substrates has the supporting substrate and the semiconductor element.

3. The semiconductor module according to claim 1, further comprising an insulating support supporting a terminal electrically connected to the semiconductor element, the insulating support being attached to the base.

4. The semiconductor module according to claim 1, wherein
    the base has a recess or a protrusion as the structure.

5. The semiconductor module according to claim 4, wherein
    the base has a groove as the structure.

6. The semiconductor module according to claim 5, wherein
    the groove becomes deeper along an extending direction of the groove.

7. The semiconductor module according to claim 1, further comprising a fixing member fixing the at least one circuit substrate to the base.

8. The semiconductor module according to claim 1, wherein
    the structure is formed asymmetrically about an axis line that passes the center of the main surface of the at least one circuit substrate and is perpendicular to the main surface.

9. The semiconductor module according to claim 1, wherein the wide bandgap semiconductor is SiC or GaN.

10. A method for manufacturing a semiconductor module comprising a step of
    fitting at least one circuit substrate with a base, the at least one circuit substrate including a supporting substrate and a semiconductor element supported by the supporting substrate, wherein
    the base and/or the supporting substrate has a structure for fitting a main surface of the at least one circuit substrate with the base, the main surface facing the base, and
    wherein the semiconductor element includes a wide bandgap semiconductor.

11. A method for manufacturing a semiconductor module comprising the steps of:
    attaching an insulating support supporting a terminal arranged opposed to a groove to a base having the groove;
    inserting a first end of a circuit substrate between the terminal and the base, the circuit substrate having a supporting substrate and a semiconductor element supported by the supporting substrate; and
    fixing a second end that is different from the first end of the circuit substrate to the base by a fixing member, to electrically connect the terminal to the semiconductor element and to fit the circuit substrate with the groove of the base.

12. The method for manufacturing a semiconductor module according to claim 11, wherein
    the groove becomes deeper toward the terminal along an extending direction of the groove.

* * * * *